(12) United States Patent
Fujiki et al.

(10) Patent No.: US 8,223,552 B2
(45) Date of Patent: Jul. 17, 2012

(54) NONVOLATILE SEMICONDUCTOR MEMORY DEVICE AND METHOD FOR DRIVING THE SAME

(75) Inventors: Jun Fujiki, Kanagawa-ken (JP); Koichi Muraoka, Kanagawa-ken (JP); Naoki Yasuda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 393 days.

(21) Appl. No.: 12/496,064

(22) Filed: Jul. 1, 2009

(65) Prior Publication Data

US 2010/0080065 A1 Apr. 1, 2010

(30) Foreign Application Priority Data

Sep. 30, 2008 (JP) ................................. 2008-252611

(51) Int. Cl.
*G11C 11/40* (2006.01)
(52) U.S. Cl. .................................................. 365/185.19
(58) Field of Classification Search .............. 365/185.19
See application file for complete search history.

(56) References Cited

U.S. PATENT DOCUMENTS

| | | | |
|---|---|---|---|
| 6,459,622 B1 | 10/2002 | Ogura et al. | |
| 2006/0139998 A1* | 6/2006 | Samachisa | 365/185.03 |
| 2008/0205156 A1* | 8/2008 | Seol et al. | 365/185.19 |
| 2009/0086544 A1* | 4/2009 | Mokhlesi et al. | 365/185.19 |

FOREIGN PATENT DOCUMENTS

| | | |
|---|---|---|
| JP | 2005-276428 | 10/2005 |
| JP | 2007-184380 | 7/2007 |
| JP | 2008-153678 | 7/2008 |

OTHER PUBLICATIONS

Masakatsu Tsuchiaki, et al., "A New Charge Pumping Method for Determining the Spatial Distribution of Hot-Carrier-Induced Fixed Charge in p-MOSFET's", IEEE Transactions on Electron Devices, vol. 40 No. 10, Oct. 1993, pp. 1768-1779.

* cited by examiner

*Primary Examiner* — Hoai V Ho
*Assistant Examiner* — Jay Radke
(74) *Attorney, Agent, or Firm* — Oblon, Spivak, McClelland, Maier & Neustadt, L.L.P.

(57) ABSTRACT

A nonvolatile semiconductor memory device includes a memory cell and a driving unit. The a memory cell has a semiconductor layer having, a channel, and a source region and a drain region provided on both sides of the channel; a first insulating film provided on the channel; a charge retention layer provided on the first insulating film; and a gate electrode provided on the charge retention layer. The driving unit applies a burst signal having a constant amplitude and a constant frequency between the gate electrode and the semiconductor layer and performs at least one of operations of programming and erasing charge on the charge retention layer.

24 Claims, 19 Drawing Sheets

NONVOLATILE SEMICONDUCTOR MEMORY DEVICE AND METHOD FOR DRIVING THE SAME

CROSS-REFERENCE TO RELATED APPLICATIONS

This application is based upon and claims the benefit of priority from the prior Japanese Patent Application No. 2008-252611, filed on Sep. 30, 2008; the entire contents of which are incorporated herein by reference.

BACKGROUND OF THE INVENTION

This invention relates to a nonvolatile semiconductor memory device in which a transistor-type memory cell having a charge retention layer and a method for driving the same.

Background Art

In a NAND-type flash memory having a charge storage layer or a floating electrode as the charge retention layer, capacity enlargement of memory capacity has been advanced by downsizing and multilevel technique of memory cells. The downsizing of memory cell transistor has been achieved through thinning of the insulating film to be applied and increasing a dielectric constant of the film. As a result, in a gate stack of a single memory cell transistor, the equivalent oxide film thickness has kept on decreasing.

As a result, large gate voltage becomes applied to the gate stack of memory cells that has become thinned, large electric field stress and current stress tend to be applied to the insulating film constituting the memory cells. When the electric field stress and current stress is applied, the problem that the interface characteristics of a semiconductor layer and the insulating film are degraded or the problem that the insulation of the insulating film is degraded is caused.

By contrast, for example, in JP-A 2007-184380 (Kokai) (Patent document 1), a nonvolatile memory in which charge is efficiently implanted by adjusting band alignment of the insulating film contacting the semiconductor in memory cells has been investigated. In Patent document 1, because a large amount of charge can be implanted to the charge retention layer with high speed, the effect of being capable of reducing the time of the stress applied to the insulating film can be recognized. This is realized by adjustment of a thickness or material of the insulating film in the memory cells, and a so-called method for controlling internal parameters has been disclosed.

However, it is necessary that the parameters inside the memory cells satisfy various requirement specifications simultaneously, and therefore, reduction of the stress of the insulating film by this method is limited.

Therefore, it is desired to develop a method for reducing the stress applied to the insulating film inside the memory cells not by the parameters inside the memory cells but by the external parameters of the driving circuit outside the memory cells. However, a technique for reducing the stress applied to the insulating film by programming pulse or erasing pulse applied to a gate electrode or a semiconductor layer has not been known before now.

In JP-A 2008-153678 (Kokai) (Patent document 2), a programming method for applying pulse voltage to the gate part at a plurality of times with applying large voltage to source and drain in the case of performing hot-hole injection in the nonvolatile semiconductor memory device having a split gate structure has been disclosed.

Moreover, in JP-A 2005-276428 (Kokai) (Patent document 3), a method for performing programming by step-up voltage has been disclosed.

In relation to the multilevel technique, for example, in U.S. Pat. No. 6,459,622B1 (Patent document 4), a technique for storing 2-bit information per memory cell by controlling capture position of charge in an NOR-type flash memory has been disclosed.

SUMMARY OF THE INVENTION

According to an aspect of the invention, there is provided a nonvolatile semiconductor memory device including: a memory cell including: a semiconductor layer having, a channel, and a source region and a drain region provided on both sides of the channel; a first insulating film provided on the channel; a charge retention layer provided on the first insulating film; and a gate electrode provided on the charge retention layer; and a driving unit configured to apply a burst signal having a constant amplitude and a constant frequency between the gate electrode and the semiconductor layer and to perform at least one of operations of programming and erasing charge on the charge retention layer According to another aspect of the invention, there is provided a method for driving a nonvolatile semiconductor memory device including a memory cell having: a semiconductor layer having, a channel, and a source region and a drain region provided on both sides of the channel; a first insulating film provided on the channel; a charge retention layer provided on the first insulating film; and a gate electrode provided on the charge retention layer, including: applying a burst signal having a constant amplitude and a constant frequency between the gate electrode and the semiconductor layer; and performing at least one of operations of programming and erasing charge on the charge retention layer.

DETAILED DESCRIPTION OF THE INVENTION

Hereinafter, embodiments of this invention will be described with reference to drawings.

The drawings are schematic or conceptual. And, the relationships between the thickness and width of each of components, specific coefficient of scales among members, and so forth are not necessarily the same as the actual ones. Moreover, even when the same portions are shown, the scales or specific coefficients are occasionally shown to be different from each other among the drawings.

Moreover, in the specification and each of the drawings, the same signs will be appended to the same components as described with respect to a previously presented drawing, and the detailed description thereof will be appropriately omitted.

First Embodiment

The nonvolatile semiconductor memory device can be applied to a transistor-type memory cell having any one of a charge storage layer and a floating electrode as the charge retention layer.

Each of the charge storage layer and the floating electrode is not necessarily one layer, and for example, may be two layers or three layers. Moreover, each of the charge storage layer or the floating electrode may be replaced by a floating dot layer (nano-crystal layer).

The floating dot layer cited here has a structure in which grains made of conductive material are dispersed in an insulator, and the size of the grains is 0.5 nm to 3 nm. This conductive material includes for example, semiconductor such as silicon, germanium and so forth, and conductor such as organic material, metal, compound such as metal silicide, metal nitride, metal carbide, metal boride and so forth. It is desirable that the floating dot layer is the particulate material as small as possible so that sufficient number of the particulate materials is contained in one memory cell, and it is desirable that the size thereof is 0.5 nm to 2 nm.

Hereinafter, the nonvolatile semiconductor memory device according to this embodiment will be described by using an example of an N-channel-type memory cell using the charge storage layer as the charge retention layer. The nonvolatile semiconductor memory device according to this embodiment is not limited to the N channel type, but can also be applied to a P channel type. In this case, impurities of the source drain regions and the semiconductor layer are set to be reverse polarities, and voltages applied to the semiconductor layer and the gate electrode are exchanged, and thereby, the following descriptions can be analogized and applied.

Figure 1:
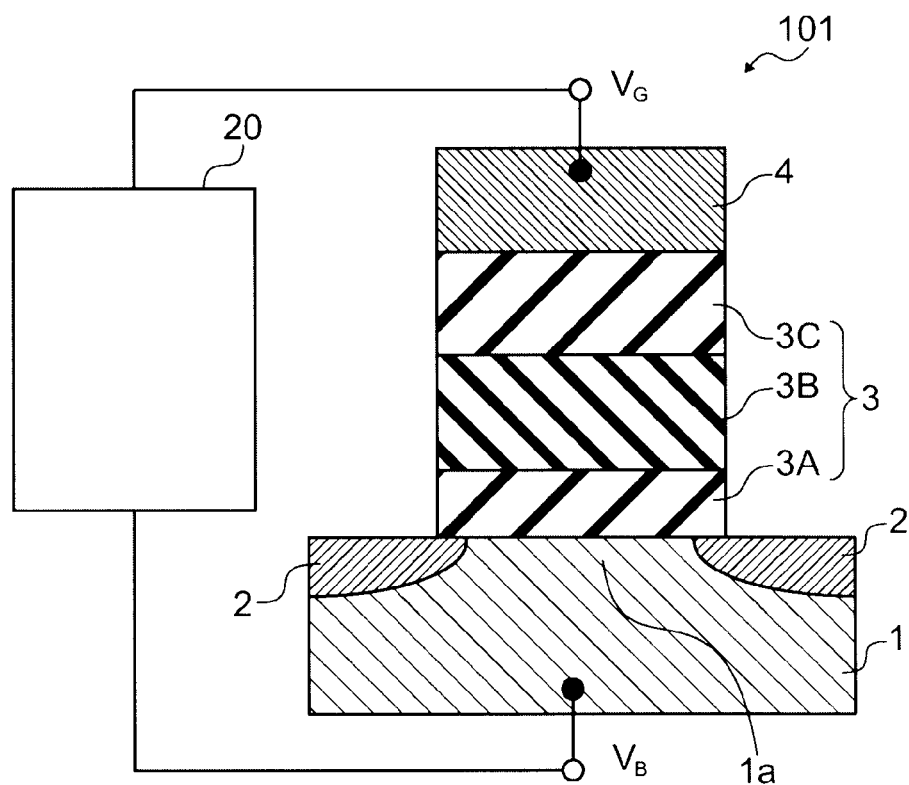
FIG. 1 is a schematic view illustrating the configuration of a nonvolatile semiconductor memory device according to a first embodiment of the invention.

FIG. 1 is a schematic view illustrating the configuration of a nonvolatile semiconductor memory device according to a first embodiment of the invention.

That is, FIG. 1 illustrates, as a schematic cross-sectional view, the configuration of a memory cell of the nonvolatile semiconductor memory device 101 according to the first embodiment of the invention, and shows one transistor-type memory cell. In FIG. 1, a memory cell is formed on a semiconductor layer 1 doped with a p-type impurity. The form of the semiconductor layer said here includes a P-type well, or a P-type semiconductor layer, or a P-type polysilicon layer. For the layers, a silicon bulk substrate or an SOI (Silicon On Insulator) layer can be used.

As shown in FIG. 1, in the nonvolatile semiconductor memory device 101 according to this embodiment, on the semiconductor layer 1, a stacked structure 3 including the charge retention layer 3B is provided. And, on the stacked structure 3, a gate electrode 4 is provided. The stacked structure 3 has the charge retention layer 3B, a first insulating film 3A provided between the charge retention layer 3B and the semiconductor layer 1, and a second insulating film 3C provided between the charge retention layer 3B and the gate electrode 4. And, a driving unit 20 is connected to a memory cell having such a structure.

The charge retention layer 3B may be a charge storage layer or a floating dot layer or a floating electrode. That is, the charge retention layer 3B may be a conductive layer, and in this case, as the charge retention layer 3B, a semiconductor material such as silicon or germanium may be used. As another form thereof, a metal material such as Au or Pt may be used.

Figure 2:
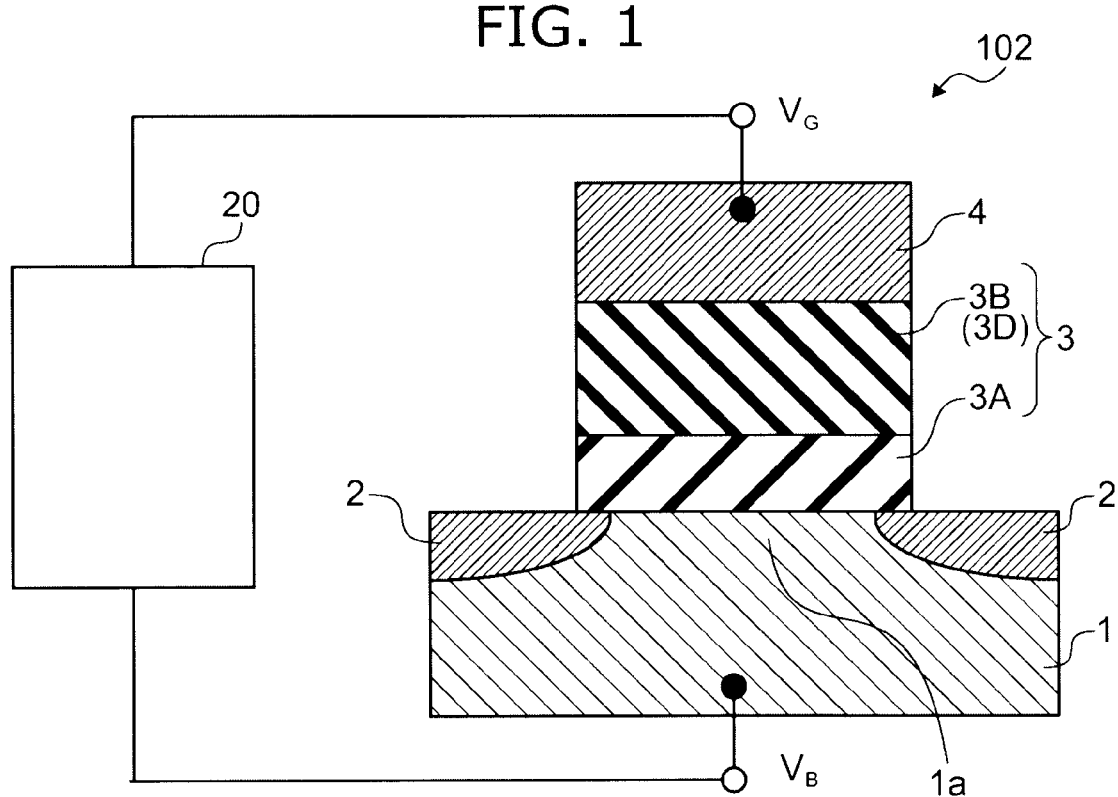
FIG. 2 is a schematic view illustrating the configuration of another nonvolatile semiconductor memory device according to the first embodiment of the invention.

FIG. 2 is a schematic view illustrating the configuration of another nonvolatile semiconductor memory device according to the first embodiment of the invention.

As shown in FIG. 2, in the nonvolatile semiconductor memory device 102 according to the first embodiment of the invention, on the semiconductor layer 1, the stacked structure 3 is provided. The stacked structure 3 includes the charge retention layer 3B, and in this specific example, as the charge retention layer 3B, the charge storage layer 3D is used. And, on the stacked structure 3, the gate electrode 4 is provided. The stacked structure 3 has the charge storage layer 3D to be the charge retention layer 3B and the first insulating layer 3A provided between the charge storage layer 3D and the semiconductor layer 1. As described above, according to the structure of the charge retention layer 3B, the second insulating film 3C can be omitted.

"Charge storage layer" is an appellation of an insulating film having a function of capturing injected charge. The charge storage layer 3D has, for example, discrete traps. The discrete traps are distributed spatially, and are distributed in the charge storage layer 3D or in the vicinity of the interface of the side of the semiconductor layer 1 (namely, on the side of the first insulating film 3A) in the charge storage layer 3D. For the charge storage layer 3D, for example, nitride silicon film can be used, or a metal oxide film having high density of the discrete traps. Moreover, it is also possible that the charge storage layer 3D is composed by stacking a plurality of materials having discrete traps. Furthermore, for the charge storage layer 3D, an insulating layer having no discrete traps in the charge storage layer 3D can be applied.

Hereinafter, the charge retention layer 3B including the charge storage layer 3D will be described.

To the charge retention layer 3B, various materials alone or in combination may be applied such as silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride aluminate (HfAlON), hafnium silicate (HfSiO), hafnium nitride silicate (HfSiON), lanthanum oxide ($La_2O_3$), and lanthanum aluminate ($LaAlO_3$).

As examples of using a structure of the charge storage layer 3D having a stacked structure as the charge retention layer 3B, when, for example, silicon nitride is represented by "N" and aluminum oxide is represented by "A" and a material including hafnia as the main element is represented by "H" and a material including lanthanum as the main element is represented by "L", various stacked structures such as NA, NH, NL, NAN, NHN, NLN, NHA, NAL, and AHL (in indeterminate order in each of them) can be applied to the charge retention layer 3B.

The first insulating film 3A has a function of electrically separating the charge retention layer 3B from the semiconductor layer 1 and confining charge in the charge retention layer 3B during charge retention. On the other hand, the second insulating film 3C has a function of electrically separating the charge retention layer 3B from the gate electrode 4 and confining charge in the charge retention layer 3B during charge retention.

The first insulating film 3A and the second insulating film 3C have larger effects of confining charge in the charge retention layer 3B as the potential barriers thereof becomes higher with respect to the charge retention layer 3B.

For the first insulating film 3A and the second insulating film 3C, silicon oxide can be used. However, another material can be substituted as long as it has the potential barrier with respect to the charge retention layer 3B. The first insulating film 3A and the second insulating film 3C can be based on various materials such as silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride aluminate (HfAlON), hafnium silicate (HfSiO), hafnium nitride silicate (HfSiON), lanthanum oxide ($La_2O_3$), and lanthanum aluminate ($LaAlO_3$).

The gate electrode 4 is formed on the stacked structure 3 and by ion-implantation of N-type impurities into semiconductor layer 1 using the gate electrode 4 as a mask, the source drain regions 2 (source region and drain region) are formed.

Hereinafter, the case of operating the nonvolatile semiconductor memory device 101 according to this embodiment will be described. However, the nonvolatile semiconductor memory device 102 operates the same.

Figure 3A:
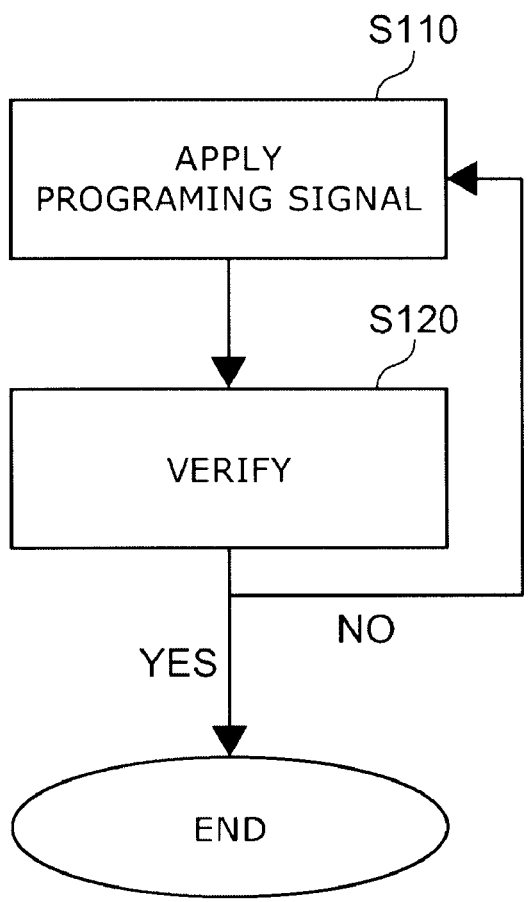
FIGS. 3A and 3B are schematic views illustrating a driving method applied to the nonvolatile semiconductor memory device according to the first embodiment of the invention.
Figure 3B:
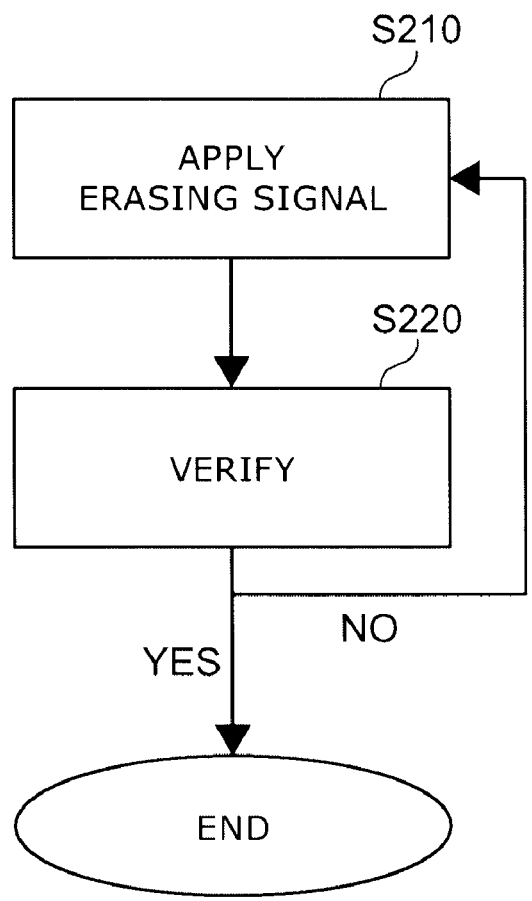

FIGS. 3A and 3B are schematic views illustrating a driving method applied to the nonvolatile semiconductor memory device according to the first embodiment of the invention.

That is, FIGS. 3A and 3B are applied to the nonvolatile semiconductor memory device 101 according to this embodiment. FIGS. 3A and 3B represent sequences of programming operation and erasing operation, respectively.

As shown in FIG. 3A, in the programming operation, first, a programming signal is applied to the memory cell (Step S110), and then verifying operation is performed (Step S120). And, until the threshold of the memory cell reaches a target value, application of the programming signal (Step S110) and the verifying operation (Step S120) are repeated.

Similarly, as shown in FIG. 3B, in the erasing operation, first, an erasing signal is applied to the memory cell (Step 210), and then verifying operation is performed (Step S 220). And, until the threshold of the memory cell reaches a target value, application of the erasing signal (Step S210) and the verifying operation (Step S220) are repeated.

Here, the verifying operation (Step S120 and Step 220) corresponds to the operation reading the threshold value by applying a verifying signal (inspection reading signal). At the stage that the threshold value reaches a target value by the verifying operation, the sequence of the programming operation or the erasing operation ends. For the verifying operation, for example, a method described in Patent document 3 can be used.

Figure 4A:
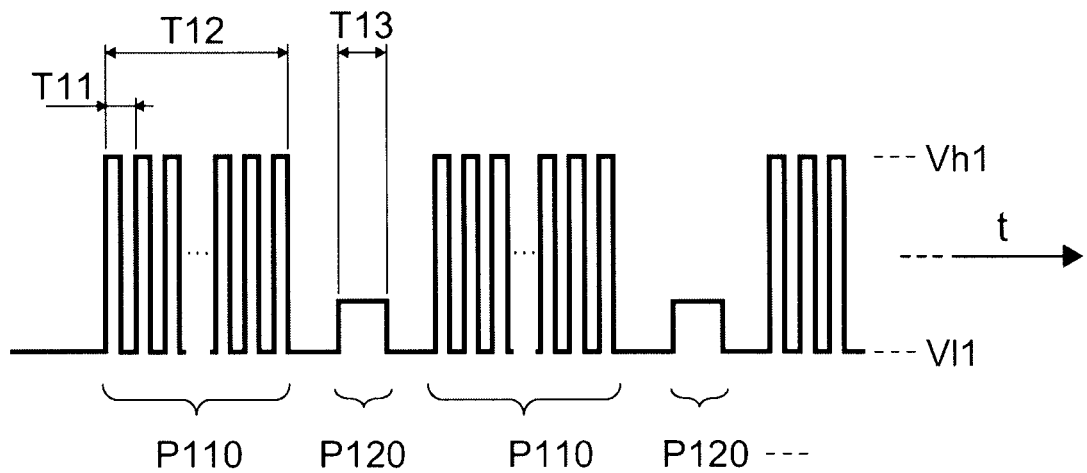
FIGS. 4A and 4B are schematic views illustrating a driving method applied to the nonvolatile semiconductor memory device according to the first embodiment of the invention.
Figure 4B:
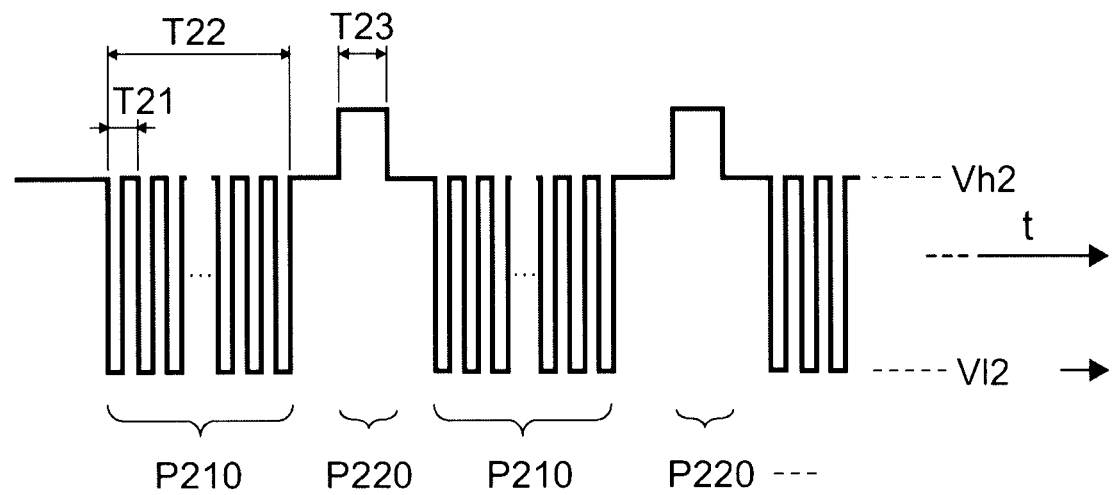

FIGS. 4A and 4B are schematic views illustrating a driving method applied to the nonvolatile semiconductor memory device according to the first embodiment of the invention.

That is, FIG. 4A illustrates a driving waveform used in the programming operation, and FIG. 4B illustrates a driving waveform used in the erasing operation. In the figures, the axis of horizontal direction represents time t. On the other hand, in the figures, the vertical axis represents a potential difference applied between the semiconductor layer 1 and the gate electrode 4. The potential difference said here represents potential of the gate electrode 4 with reference to the potential of the semiconductor layer 1.

As shown in FIG. 4A, for the programming operation, in applying the programming signal to the memory cell (Step S110), a burst signal P110 for programming is applied. For the verifying operation (Step S120), a verifying signal P120 is applied. In accordance with repeating of Step S110 and the Step 120, the burst signal P110 for programming and the verifying signal P120 are repeatedly applied. Until the threshold read in the verifying operation (Step S120) reaches a target value, application of the burst signal P110 for programming (Step S110) is repeated.

As described above, in the nonvolatile semiconductor memory device 101 according to this embodiment, as the programming signal, a burst signal P110 for programming in which a plurality of pulses are applied continuously over a certain time is used. The burst signal P110 for programming has a constant amplitude and a constant frequency. Here, the amplitude is an absolute value of a difference between the highest voltage and the lowest voltage in the write burst signal P110. However, the fluctuation by noise or the like is ignored.

A period of pulse contained in the burst signal P110 for programming is set to be period T11 (Ta), and a time of the burst signal P110 for programming is set to be T12 (Tb). The burst frequency Fb1 for programming of the burst signal P110 for programming is the inverse of the period T11. In the burst signal P110 for programming, the burst signal frequency Fb1 for programming is constant, namely, the period T11 is constant.

The number of the pulses contained in the burst signal P110 for programming becomes (T12/T11). In this case, when duty ratio of one pulse is, for example, 50%, (T12/T11)×T11 is displaced from T12, and the difference thereof becomes (T11)/2. However, because the difference is small, here the difference is ignored. That is, the burst signal P110 for programming includes (T12/T11) pieces of pulses each having period T11. The duty ratio of one pulse may be other than 50% and optional.

And, the burst signal P110 for programming, namely, each of the pulses included in the burst signal P110 for programming has high-level voltage (Vh1) and low-level voltage (Vl1). Here, the high-level voltage (Vh1) is higher than the low-level voltage (Vl1). In the burst signal P110 for programming, the value of the high-level voltage (Vh1) is constant and the value of the low-level voltage (Vl1) is constant. In this specific example, the absolute value of difference between the high-level voltage (Vh1) and the low level voltage (Vl1) is the amplitude of the burst signal P110 for programming and the amplitude is constant. However, the fluctuation by noise or the like is ignored.

On the other hand, the verifying signal P120 has a length of time T13. An absolute value of the voltage of the verifying signal P120 is set to be smaller than the absolute value of the high-level voltage (Vh1) so that the state of programmed charge is not substantially affected.

The period T11 of each of the pulses included in the burst signal P110 for programming is shorter than the time T13 of the verifying signal P120. That is, the burst frequency Fb1 for programming is higher than the frequency corresponding to the time T13 of the verifying signal P120.

Similarly, as shown in FIG. 4B, for the erasing operation, in applying the erasing signal to the memory cell (Step S210), an burst signal P210 for erasing is applied as the erasing signal. As the verifying operation (Step S220), a verifying signal P220 is applied. In accordance with repeating of Step S210 and the Step 220, the burst signal P210 for erasing and the verifying signal P220 are repeatedly applied. And, until the threshold read in the verifying operation (Step S220) reaches a target value, application of the burst signal P210 for erasing (Step S210) is repeated.

As described above, in the nonvolatile semiconductor memory device 101 according to this embodiment, as the erasing signal, a burst signal P210 for erasing in which a plurality of pulses are applied continuously over a certain time is used. The burst signal P210 for erasing has a constant amplitude and a constant frequency. Here, the amplitude is an absolute value of a difference between the highest voltage and the lowest voltage in the burst signal P210 for erasing. However, the fluctuation by noise or the like is ignored.

A period of pulse contained in the burst signal P210 for erasing is set to be period T21 (Ta), and a time of the burst signal P210 for erasing is set to be T22 (Tb). The burst frequency Fb2 for erasing is the inverse of the period T21. In the burst signal P210 for erasing, the burst signal frequency Fb2 for erasing is constant, namely, the period T21 is constant.

In this case, the number of the pulses included in the burst signal P210 for erasing becomes (T22/T21). In this case, when duty ratio of one pulse is, for example, 50%, (T22/T21)×T21 is displaced from T22, and the difference thereof becomes (T21)/2. However, because the difference is small, here the difference is ignored. That is, the burst signal P210 for erasing includes (T22/T21) pulses each having period T21. The duty ratio of one pulse may be other than 50% and optional.

And, the burst signal P210 for erasing, namely, each of the pulses included in the burst signal P210 for erasing has high-level voltage (Vh2) and low-level voltage (Vl2). Here, the high-level voltage (Vh2) is higher than the low-level voltage (Vl2). In the burst signal P210 for erasing, the value of the high-level voltage (Vh2) is constant and the value of the low-level voltage (Vl2) is constant. In this specific example, the absolute value of difference between the high-level voltage (Vh2) and the low level voltage (Vl2) is the amplitude of the burst signal P210 for erasing and the amplitude is constant. However, the fluctuation by noise or the like is ignored.

On the other hand, the verifying signal P220 has a length of time T23. An absolute value of the voltage of the verifying signal P220 is set to be smaller than the absolute value of the low-level voltage (Vl2) so that the state of erased charge is not substantially affected.

The period T21 of each of the pulses included in the burst signal P210 for erasing is shorter than the time T23 of the verifying signal P220. That is, the burst frequency Fb2 for erasing is higher than the frequency corresponding to the time T23 of the verifying signal P220.

To the burst signal P110 for programming and the burst signal P210 for erasing, as described as follows, various shapes can be applied.

FIGS. 5A to 5D are schematic views illustrating driving waveforms in programming operation applied to the nonvolatile semiconductor memory device according to the first embodiment of the invention.

FIGS. 6A to 6D are schematic views illustrating driving waveforms in erasing operation applied to the nonvolatile semiconductor memory device according to the first embodiment of the invention.

That is, FIGS. 5A to 5D and 6A to 6D illustrates the burst signal P110 for erasing and the burst signal P210 for erasing that are applied between the semiconductor layer 1 and the gate electrode 4, respectively.

Figure 5A:
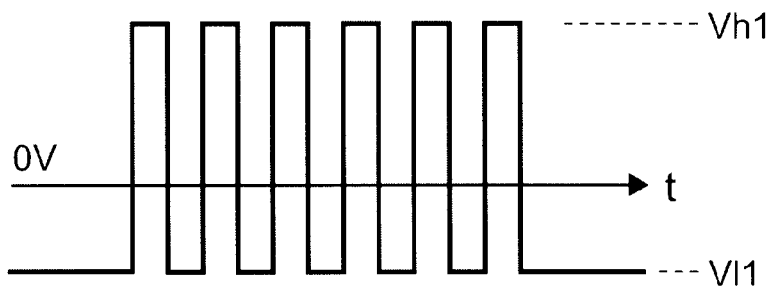
FIGS. 5A to 5D are schematic views illustrating driving waveforms in programming operation applied to the nonvolatile semiconductor memory device according to the first embodiment of the invention.

As shown in FIG. 5A, in one example of the burst signal P110 for programming, each of the pulses composing the burst signal P110 for programming has a shape of an approximately square wave.

As illustrated in FIG. 5A, the low-level voltage (Vl1) is not necessarily set to be 0V, and may be other than 0V. In the burst signal P110 for programming, it is sufficient that the absolute value of the high-level voltage (Vh1) is larger than the absolute value of the low-level voltage (Vl1).

Figure 5B:
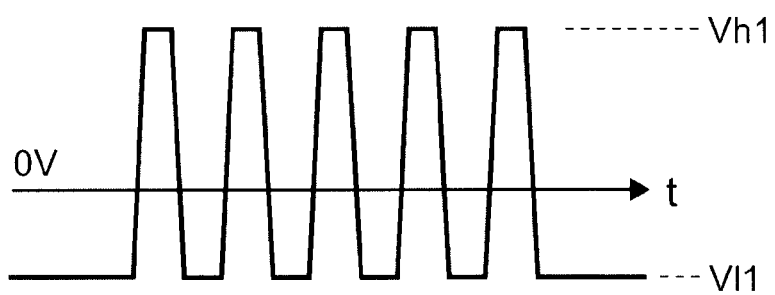

As shown in FIG. 5B, in another example of the burst signal P110 for programming, each of the pulses has a trapezoidal shape. That is, in this example, mutual change of the high-level voltage (Vh1) and the low-level voltage is not performed instantly, but the change requires a certain degree of time.

Figure 5C:
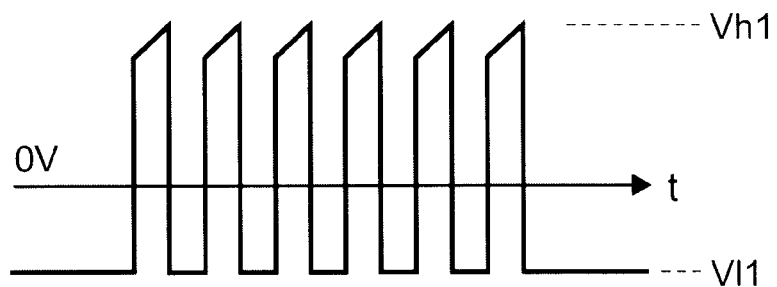

As shown in FIG. 5C, in another example of the burst signal P110 for programming, each of the pulses has a triangular shape in which the voltage is not constant in the vicinity of the high-level voltage (Vh1).

Figure 5D:
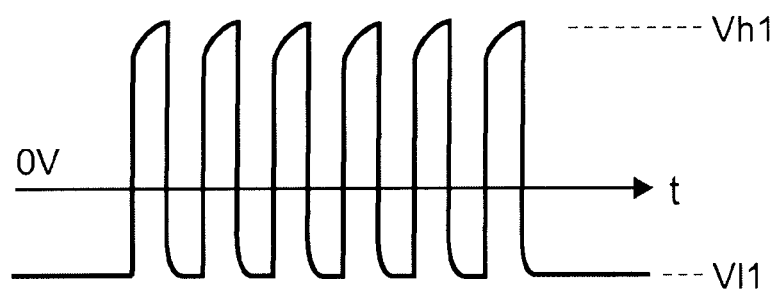

As shown in FIG. 5D, in another example of the burst signal P110 for programming, each of the pulses has a waveform that is a distorted shape such as a charging current.

As shown in FIGS. 5C and 5D, also in the cases where the pulse voltage waveform has a triangular shape or a distorted shape, the highest voltage of the burst signal P110 for programming is the high-level voltage (Vh1) and the lowest voltage is the low-level voltage (Vl1), and the amplitude that is the absolute value of the difference thereof is constant.

As described above, the burst signal P110 for programming applicable to the programming operation can have various shapes such as square shape, trapezoidal shape, triangular shape, and shape like charging current as long as having a so-called burst shape of continuously applying a plurality of pulses, and the shape thereof is optional. As described above, in the burst signal P110 for programming, for example, voltage in the part near to the high-level voltage (Vh1) may be changed but the way of the change is the same in the write burst signal P110.

Also, in every one of the above cases, the low-level voltage (Vl1) can be set to be various voltages.

Figure 6A:
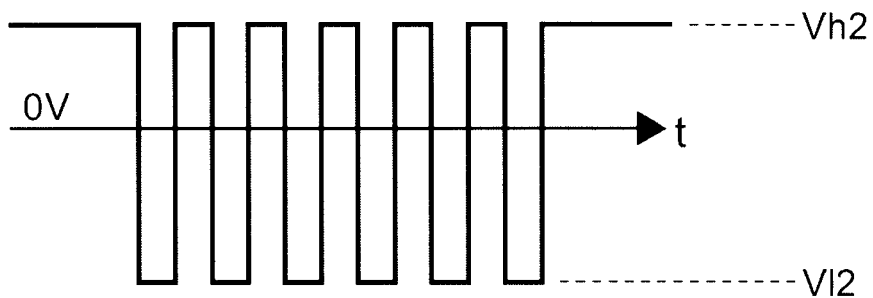
FIGS. 6A to 6D are schematic views illustrating driving waveforms in erasing operation applied to the nonvolatile semiconductor memory device according to the first embodiment of the invention.

On the other hand, as shown in FIG. 6A, in one example of the burst signal P210 for erasing, each of the pulses constituting the burst signal P210 for erasing has a shape of an approximately square wave.

As illustrated in FIG. 6A, the high-level voltage (Vh2) is not necessarily set to be 0V, and may be other than 0V. In the burst signal P210 for erasing, it is sufficient that the absolute value of the low-level voltage (Vl2) is larger than the absolute value of the high-level voltage (Vh2).

Figure 6B:
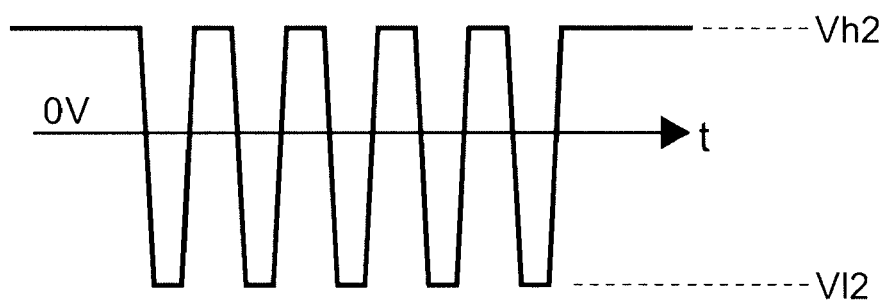

As shown in FIG. 6B, in another example of the burst signal P210 for erasing, each of the pulses has a trapezoidal shape.

Figure 6C:
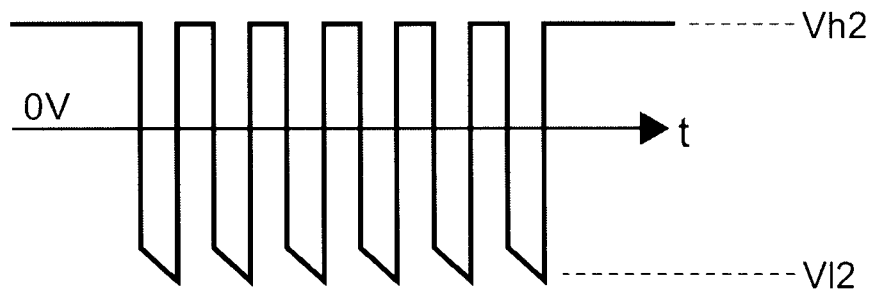

As shown in FIG. 6C, in another example of the burst signal P210 for erasing, each of the pulses has a triangular shape in which the voltage is not constant in the vicinity of the low-level voltage (Vl2).

Figure 6D:
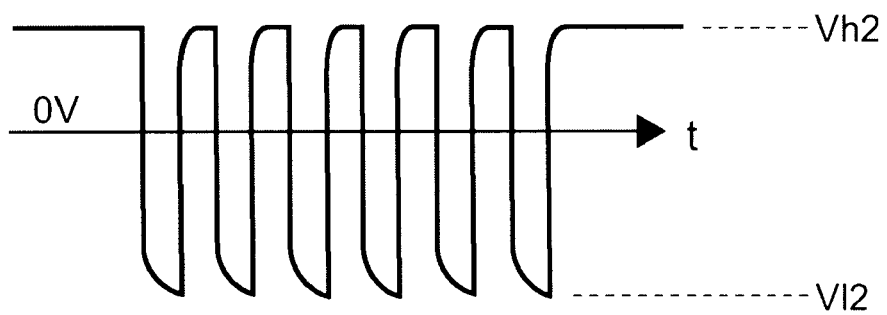

As shown in FIG. 6D, in another example of the burst signal P210 for erasing, each of the pulses has a waveform that is a distorted shape such as charging current.

As shown in FIGS. 6C and 6D, also in the cases where the pulse voltage waveform has a triangular shape or a distorted shape, the highest voltage of the burst signal P210 for erasing is the high-level voltage (Vh2) and the lowest voltage is the low-level voltage (Vl2), and the amplitude that is the absolute value of the difference thereof is constant.

As described above, the burst signal P210 for erasing can have various shapes such as square shape, trapezoidal shape, triangular shape, and shape like a charging current as long as the waveform thereof is a burst shape, and the shape thereof is optional. In the burst signal P210 for erasing, for example, voltage in the part near to the low-level voltage (Vl2) may be changed but the way of the change is the same in the burst signal P210 for erasing.

Also, in every one of the above cases, the high-level voltage (Vh2) can be set to be various voltages.

As described above, to the burst signal P210 for erasing applicable to the erasing operation, various shapes and voltage values can be applied as long as having a so-called burst shape of continuously applying a plurality of pulses.

To the pulse parameters used for the burst signal P110 for programming, various values can be applied. For example, for the pulse parameter applied to the burst signal P110 for programming, the period T11 of one pulse can be 100 nanoseconds to 0.1 milliseconds. That is, the burst frequency Fb1 for programming can be 10 kHz to 10 MHz.

When the application time of the burst signal P110 for programming is T12 seconds, the number of times of application of pulses can be T12/T11. And, in one pulse, the rise time and fall time can be T11/20 seconds to T11/2 seconds. The high-level voltage (Vh1) is higher than the low-level voltage (Vl1), and the absolute value of the high-level voltage (Vh1) is larger than the absolute value of the low-level voltage (Vl1). The rise time is a time for the pulse to change from the low-level voltage to the high-level voltage and the fall time is a time for the pulse to change from the high-level voltage to low-level voltage.

Similarly, also to the pulse parameters used for the burst signal P210 for erasing, various values can be applied. For example, for the pulse parameter applied to the burst signal P210 for erasing, the period T21 of one pulse can be 100 nanoseconds to 0.1 milliseconds. That is, the burst frequency Fb2 for erasing can be 10 kHz to 10 MHz.

When the application time of the burst signal P210 for erasing is T22 seconds, the number of times of application of pulses can be T22/T21. And, in one pulse, the rise time and fall time can be T21/20 seconds to T21/2 seconds. The high-level voltage (Vh2) is higher than the low-level voltage (Vl2), and the absolute value of the low-level voltage (Vl2) is larger than the absolute value of the high-level voltage (Vh2).

The burst frequency Fb2 for erasing may be the same as or different from the burst frequency Fb1 for programming. Hereinafter, the case where the burst frequency Fb2 for erasing is the same as the burst frequency Fb1 for programming will be described.

As described above, to the pulse parameters used for the burst signal P110 for programming and the burst signal P210 for erasing, various values can be applied. It is preferable that the period T11 and the period T21 of the pulse parameters are set to be in the range of 100 nanoseconds to 0.1 milliseconds in consideration of the high-speed operation and the wiring delay. That is, if the periods are longer than 0.1 milliseconds, the operation becomes slower, and if the periods are shorter than 100 nanoseconds, the waveform is distorted by the wiring delay, and a desired signal cannot be applied, and the programming operation or the erasing operation cannot be normally performed.

For reducing the electric stress applied to the first insulating film 3A and the second insulating film 3C, the high-level voltage (Vh1, Vh2) and the low-level voltage (Vl1, Vl2) are set so that a equivalent electric field in the oxide film to be applied to the first insulating film 3A and the second insulating film 3C are contained in the range of 10 MV/cm to 20 MV/cm.

That is, when the burst signal P110 for programming is applied to the gate electrode 4, the high-level voltage (Vh1) is set to be the voltage which the equivalent electric field in the oxide film to be applied to the first insulating film 3A is 10 MV/cm to 20 MV/cm.

On the other hand, when the burst signal P210 for erasing is applied to the gate electrode 4, the low-level voltage (Vl2) is set to be the voltage which the equivalent electric field in the oxide film to be applied to the first insulating film 3A is 10 MV/cm to 20 MV/cm.

Furthermore, for more effectively reducing the electric field stress applied to the first insulating 3A and the second insulating 3C and stably performing operation, the following is desirable.

That is, when the burst signal P110 for programming is applied to the gate electrode 4, the high-level voltage (Vh1) is set to be a value which the equivalent electric field of the oxide film of the first insulating film 3A corresponds to a programming electric field of 15 MV/cm or more.

On the other hand, when the burst signal P210 for erasing is applied to the gate electrode 4, the low-level voltage (Vl2) is set to be a value which the equivalent electric field in the oxide film of the first insulating film 3A corresponds to a programming electric field of 15 MV/cm or more.

As described above, in the nonvolatile semiconductor memory device 101 according to this embodiment, in at least any one of the programming operation and erasing operation, by using the burst signal P110 for programming and the burst signal P210 for erasing, at least any one of the programming operation and the erasing operation is performed. As described above, by using the burst signal in the programming operation or the erasing operation, degradation at the interface between the semiconductor layer 1 and the first insulating film 3A can be reduced. That is, the stress applied to the insulating film is reduced, and thereby, the nonvolatile semiconductor memory device with high reliability can be provided.

Hereinafter, evaluation results of characteristics of the nonvolatile semiconductor memory device 101 according to third embodiment will be described.

As the index indicating reliability in the nonvolatile semiconductor memory device 101, an increase amount $\Delta$Nit of the interface states generated in repeating programming and erasing can be used. The increase amount $\Delta$Nit of the interface states is degradation at the interface between the semiconductor layer 1 and the first insulating film 3A that is made to be an index. Here, the increase amount $\Delta$Nit of the interface states is difference between the initial amount of the interface states before performing programming and erasing and the amount of the interface states after repeating programming and erasing.

Hereinafter, in the nonvolatile semiconductor memory device 101 described as the specific example, the memory cell has the following structure. That is, the memory cell is an n-type channel MOSFET, and the first insulating film 3A is a silicon oxynitride film (the film thickness is 4 nm), the charge retention layer 3B (charge storage layer 3D) is silicon nitride film (the film thickness is 5 nm), and the second insulating film 3C is a stacked insulating film of the aluminum oxide film (the film thickness is 20 nm) and the silicon nitride film (the film thickness is 2 nm), and the gate electrode 4 is n-type polysilicon.

And, in the nonvolatile semiconductor memory device 101 having such a structure, by using the burst signal P110 for programming and the burst signal P210 for erasing, programming and erasing were repeated, and the relation of the number of repeating to the increase amount $\Delta$Nit of the interface state in this case was evaluated.

Figure 7A:
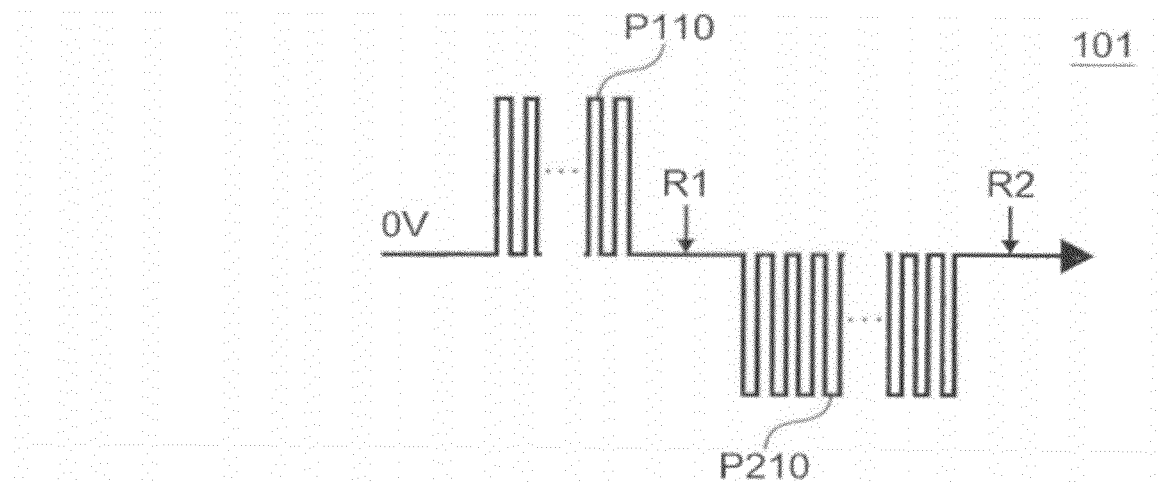
FIGS. 7A and 7B are schematic views illustrating characteristics of the nonvolatile semiconductor memory device according to the first embodiment of the invention.
Figure 7B:
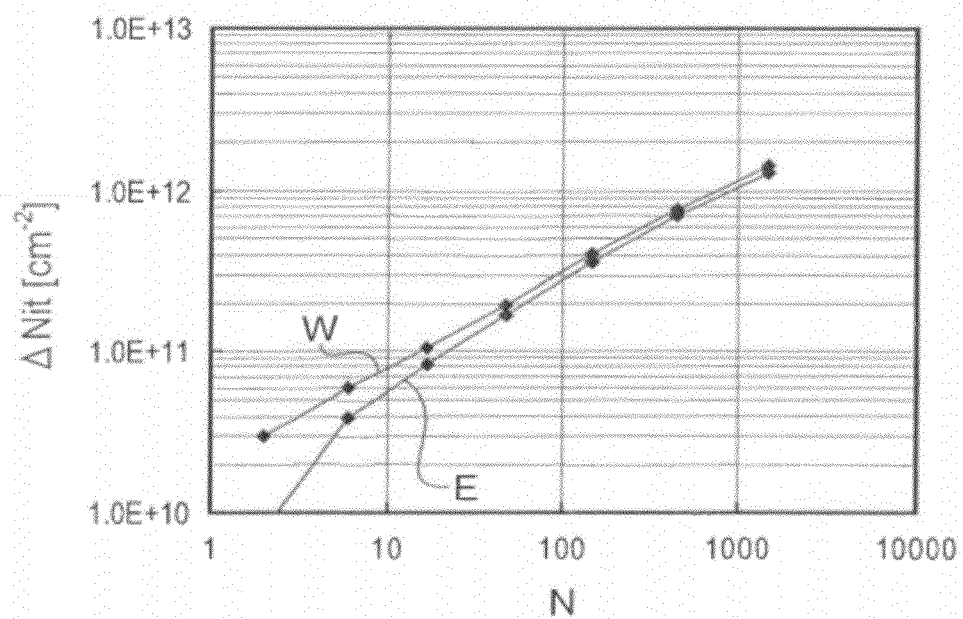

FIGS. 7A and 7B are schematic views illustrating characteristics of the nonvolatile semiconductor memory device according to the first embodiment of the invention.

That is, FIG. 7A illustrates waveforms of programming and erasing used in the nonvolatile semiconductor memory device 101 according to this embodiment. And, FIG. 7B shows a graph illustrating the evaluation result, and the horizontal axis represents the number N of repeating of programming and erasing, and the vertical axis represents the increase amount $\Delta$Nit of the interface state. FIG. 7B indicates characteristics in programming W and erasing E.

As shown in FIG. 7A, in this evaluation experiment, the burst signal P110 for programming and the burst signal P210 for erasing are repeatedly applied, and the number N of repeating thereof is changed, and the threshold reading R1 after programming and the threshold reading R2 after erasing are performed.

And, the pulse parameters used in the burst signal P110 for programming is as follows. Namely, the high-level voltage (Vh1) is 20 V and the low-level voltage (Vl1) is 0 V. The period T11 of one pulse is 2 μs, namely, the burst frequency Fb1 for programming is 500 kHz. The application time T12 of one burst signal P110 for programming is 200 μs, and that is, the number of the pulses per burst signal P110 for programming is 100. The duty ratio in one period T11 is 50%, and the rise time and the fall time are 200 ns, respectively.

On the other hand, the pulse parameters used in the burst signal P210 for erasing is as follows. Namely, the high-level voltage (Vh2) is 0 V and the low-level voltage (Vl2) is −18 V. The period T21 of one pulse is 2 μs, namely, the burst frequency Fb1 for erasing is 500 kHz. The application time T22 of one burst signal P210 for erasing is 2 ms, and that is, the number of the pulses per burst signal P210 for erasing is 1000. The duty ratio in one period T21 is 50%, and the rise time and the fall time are 200 ns, respectively.

As shown in FIG. 7B, in the nonvolatile semiconductor memory device 101 according to this embodiment, as the number N of repeating of programming or erasing increases, the increase amount $\Delta$Nit of the interface state increases. However, with respect to the number N of repeating of programming or erasing, the increase of the increase amount $\Delta$Nit of the interface state is suppressed, as compared to the first comparative example to be described below.

First Comparative Example

Figure 8A:
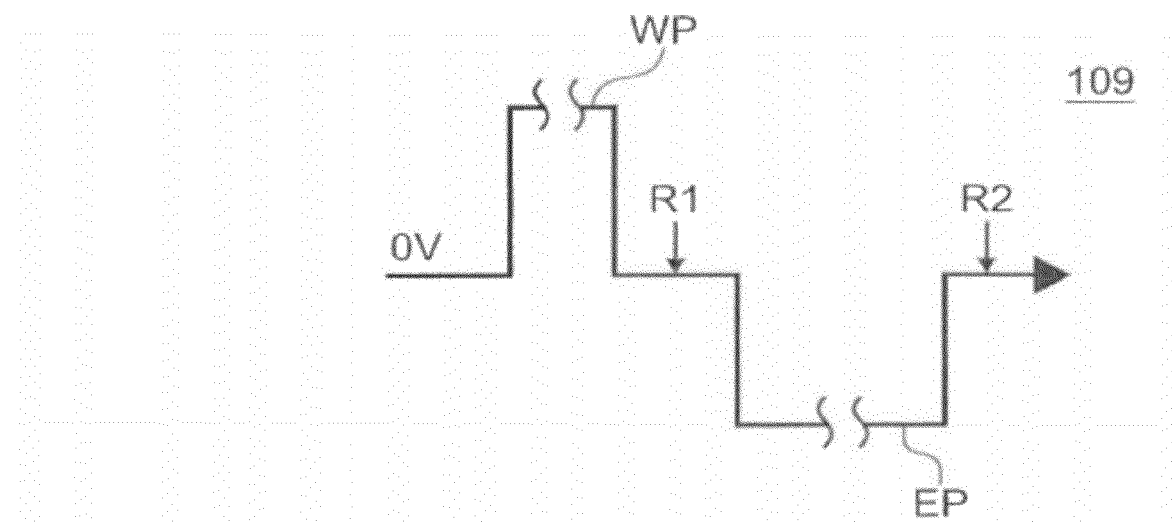
FIGS. 8A and 8B are schematic views illustrating characteristics of the nonvolatile semiconductor memory device of a first comparative example.
Figure 8B:
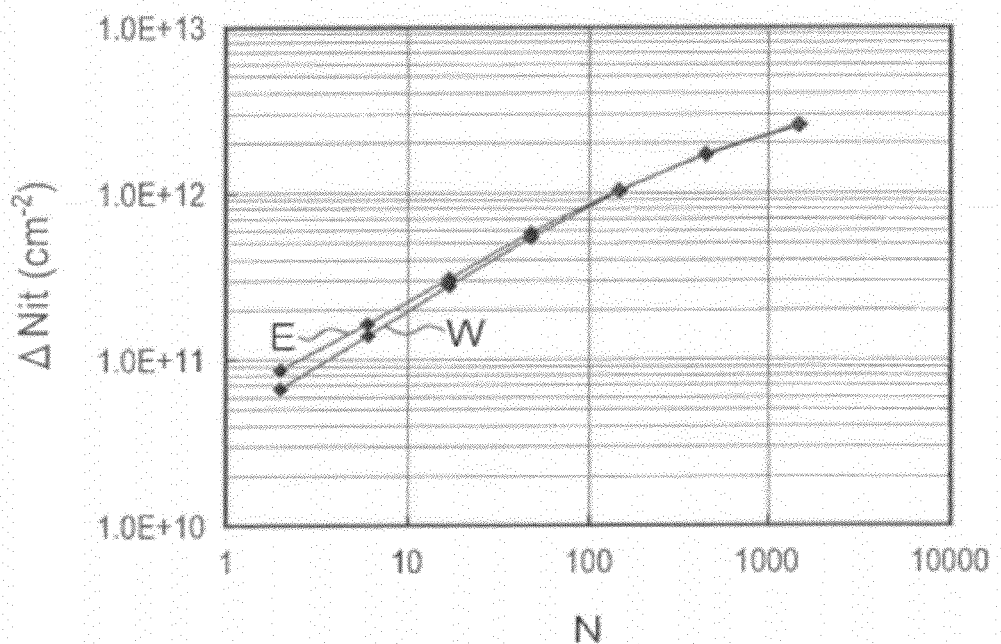

FIGS. 8A and 8B are schematic views illustrating characteristics of the nonvolatile semiconductor memory device of a first comparative example.

That is, FIG. 8A illustrates waveforms of programming and erasing used in the nonvolatile semiconductor memory device 109 of the first comparative example. FIG. 8B shows a graph illustrating an evaluation result, and the horizontal axis represents the number N of repeating of programming and erasing, and the vertical axis represents the increase amount $\Delta$Nit of the interface state.

The configuration of the memory cell of the nonvolatile semiconductor memory device 109 of the first comparative example is the same as the nonvolatile semiconductor memory device 101. However, as described below, the waveforms used for programming and erasing are different.

That is, as shown in FIG. 8A, in the nonvolatile semiconductor memory device 109 of the first comparative example, the pulse for programming and the pulse for erasing are not burst signals but are single pulses, respectively. And, by repeatedly applying programming and erasing, the number N of repeating thereof is changed, the threshold reading R1 after programming and the threshold reading R2 after erasing are performed.

And, pulse parameters of the pulse WP for programming are as follows. That is, the high-level voltage (Vh1) is 20 V, and the low-level voltage (Vl1) is 0 V, and the application time of the pulse WP for programming is 100 μs. The rise time and the fall time are 200 ns, respectively.

Pulse parameters of the pulse EP for erasing are as follows. That is, the high-level voltage (Vh1) is 0 V, and the low-level voltage (Vl1) is −18 V, and the application time of the pulse EP for erasing is 1 ms. The rise time and the fall time are 200 ns, respectively.

In the waveforms illustrated in FIGS. 7A and 8A, high electric field is applied to the first insulating film 3A at the programming operation or the erasing operation when the high-level voltage (Vh1) is applied in the programming operation and when the low-level voltage (Vl2) is applied in the erasing operation.

And, if it is considered that the duty ratio of the burst signal P110 for programming and the burst signal P210 for erasing in the nonvolatile semiconductor memory device 101 according to this embodiment is 50%, the sum total of the application times of the high-level voltage (Vh1) of the pulse WP for programming and the low-level voltage (Vl2) of the pulse EP for erasing in the nonvolatile semiconductor memory device 109 of the first comparative example is equal to that in the nonvolatile semiconductor memory device 101. That is, in both cases of this embodiment and the first comparative example, the total time of the applied high-level voltage (Vh1) is 100 μs for the programming operation, and the total time of the applied low-level voltage (Vl2) is 1 ms for the erasing operation.

As shown in FIG. 8B, also in the nonvolatile semiconductor memory device 109 of the first comparative example, as the number N of repeating of programming or erasing increases, the increase amount ΔNit of the interface state increases. And, with respect to the number N of repeating of programming or erasing, the increase of the increase amount ΔNit of the interface state is significantly large in comparison with the nonvolatile semiconductor memory device 101 according to this embodiment. For example, when the number N of repeating of programming or erasing is 1500, in the nonvolatile semiconductor memory device 109 of the first comparative example, both of ΔNit of the programming side W and ΔNit of the erasing side E are about $2.5 \times 10^{12}$ cm$^{-2}$.

On the other hand, as shown in FIG. 7B, in the nonvolatile semiconductor memory device 101, when the number N of times of repeating of programming or erasing is 1500, both of ΔNit of the programming side W and ΔNit of the erasing side E are about $1.1 \times 10^{12}$ cm$^{-2}$. As described above, in the nonvolatile semiconductor memory device 101 according to this embodiment, the increase amount ΔNit of the interface state is half or less in comparison with the nonvolatile semiconductor memory device 109 of the first comparative example.

As described above, it can be found that in comparison to the case of repeating programming erasing by applying a rectangular-shaped pulse like the nonvolatile semiconductor memory device 109 of the first comparative example, the increase of the interface state amount is reduced in the case of repeating programming erasing by the burst signal P110 for programming and the burst signal P210 for erasing like the nonvolatile semiconductor memory device 101 according to this embodiment.

As described above, according to the nonvolatile semiconductor memory device 101 according to this embodiment, the increase amount ΔNit of the interface state is reduced, namely, degradation at the interface between the semiconductor layer 1 and the first insulating film 3A can be reduced, and the stress applied to the insulating film is reduced, and thereby, the nonvolatile semiconductor memory device with high reliability can be provided.

Figure 9:
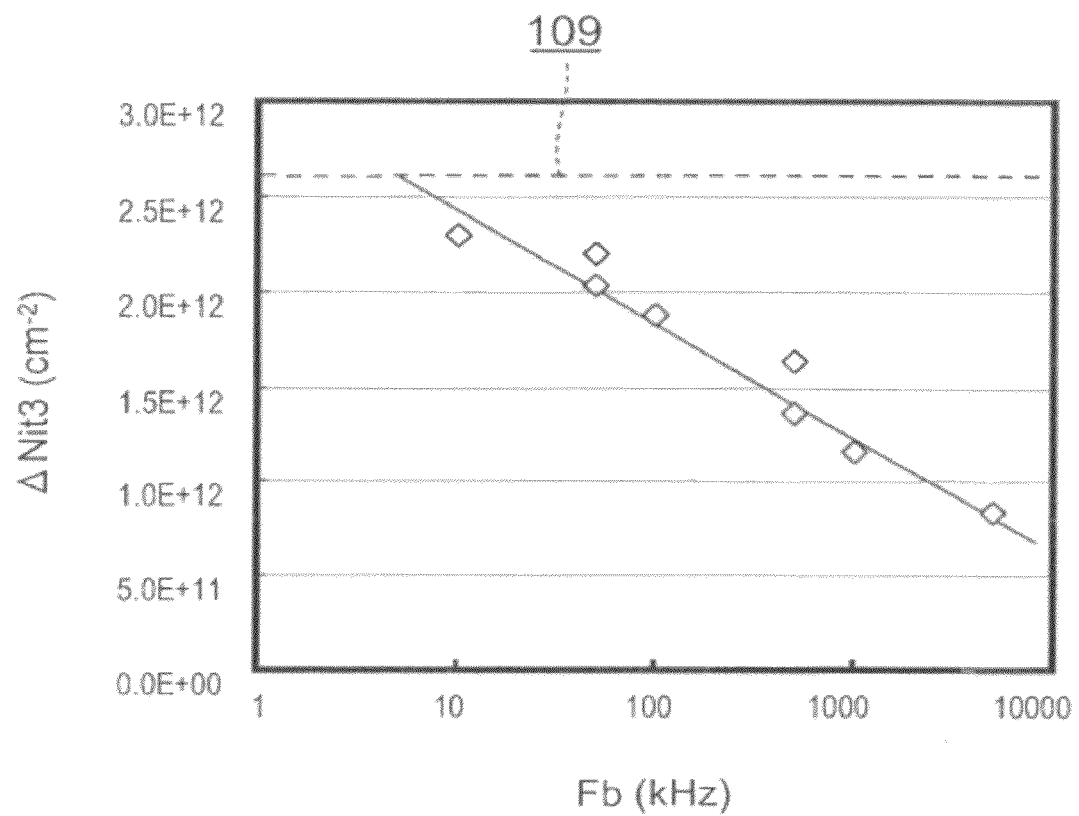
FIG. 9 shows a graph illustrating characteristics of the nonvolatile semiconductor memory device according to the first embodiment of the invention.

FIG. 9 shows a graph illustrating characteristics of the nonvolatile semiconductor memory device according to the first embodiment of the invention.

FIG. 9 illustrates a result of investigating change of the increase amount ΔNit of the interface state when programming and erasing are repeated with variously changing pulse parameters of the burst signal P110 for programming and the burst signal P210 for erasing in the nonvolatile semiconductor memory device 101 according to this embodiment. In FIG. 9, the case where the number N of repeating is 1000 is illustrated, and the vertical axis represents the increase amount ΔNit3 of the interface state when the number N of repeating is 1000. In this case, values of the erasing side are shown as the increase amount ΔNit3 of the interface state. And, the horizontal axis represents the following burst frequency Fb.

In the experiment illustrating the result in FIG. 9, the application time T12 of the burst signal P110 for programming and the application time T22 of the erase burst signal P210 for erasing were set to be the same as the experiment condition illustrated in FIGS. 7A and 7B, namely, 200 μm and 2 ms, respectively, and the period T11 of one pulse of the burst signal P110 for programming and the period T21 of one pulse of the burst signal P210 for erasing were changed. In this case, the period T11 and the period T21 were the same, namely, the burst frequency Fb1 for programming and the burst frequency Fb2 for erasing were the same and these were set to be burst frequency Fb.

As shown in FIG. 9, as the burst frequency Fb increases, the increase amount ΔNit3 of the interface state decreases. That is, as the frequency of the burst signal P110 for programming and the burst signal P210 for erasing is raised, that is, the number of the application times of pulses is increased, the increase amount ΔNit3 of the interface state decreases.

Although not shown in FIG. 9, the increase amount ΔNit3 of the interface state of the programming side also decreases as the frequency of the burst signal P110 for programming and the burst signal P210 for erasing is raised.

As described above, as the burst frequency Fb is more raised, degradation at the interface between the semiconductor layer 1 and the first insulating film 3A can be more reduced, and the stress applied to the insulating film can be more reduced, and as a result, the nonvolatile semiconductor memory device with high reliability can be provided.

Here, in FIG. 9, the increase amount ΔNit3 of the interface state when the number N of repeating is 1000 in the case of the waveform illustrated in FIG. 8A as the comparative example, namely, the nonvolatile semiconductor memory device 109 using single pulse is shown by the dashed line. According to this, when the burst frequency Fb is 6 kHz or more, it is estimated that the increase amount ΔNit3 of the interface state can be smaller compared with the comparative example.

That is, in the invention, the burst frequency Fb1 for programming and the burst frequency Fb2 for erasing can be 6 kHz or more. When the frequency is less than this, the reduction effect of the increase amount ΔNit3 of the interface state is small.

Furthermore, for reliably obtaining the reduction effect of the increase amount ΔNit3 of the interface state, the burst frequency Fb1 for programming and the burst frequency Fb2 for erasing can be 10 kHz or more. That is, when the burst frequency Fb1 for programming and the burst frequency Fb2 for erasing is less than 10 kHz, the suppression effect of the increase of the amount of the interface state is substantially low, and thus, 10 kHz or more is preferable.

And, also from the viewpoint of constituting the burst signal by dividing the application time T12 of the burst signal P110 for programming, the burst frequency Fb1 for programming can be 10 kHz or more, when, for example, the application time T12 is 100 ms.

Similarly, from the viewpoint of constituting the burst signal by dividing the application time T22 of the burst signal P210 for erasing, it can be estimated that the burst frequency Fb2 of the burst signal P210 for erasing, namely, the inverse number of the period T21 is 100 kHz or more when the application time T22 is 1 ms. However, as illustrated in FIG. 7B, the increase amount ΔNit of the interface state is smaller in the erasing operation side than in the programming operation side, and thus, practically, the burst frequency Fb2 for erasing can also be 10 kHz or more.

Furthermore, for increasing the number of times that programming and erasing can be stably performed, it is more preferable that the burst frequency Fb1 for programming and the burst frequency Fb2 for erasing are 100 kHz or more in order to suppress the increase amount ΔNit of the interface state to be lower. Thereby, higher reliability can be ensured.

On the other hand, in consideration of deformation of the signal waveform by capacity coupling or the like of wiring in the nonvolatile semiconductor memory device 101, it is preferable that the burst frequency Fb1 for programming and the burst frequency Fb for erasing is 10 MHz or less.

That is, if larger than 10 MHz, the signal waveform is deformed and the effective programming or erasing becomes difficult.

It is further preferable that the burst frequency Fb1 for programming and the burst frequency Fb2 for erasing is 1 MHz or less. Thereby, the deformation of the signal waveform can be difficult to be caused and high-precise operation can be obtained.

Figure 10A:
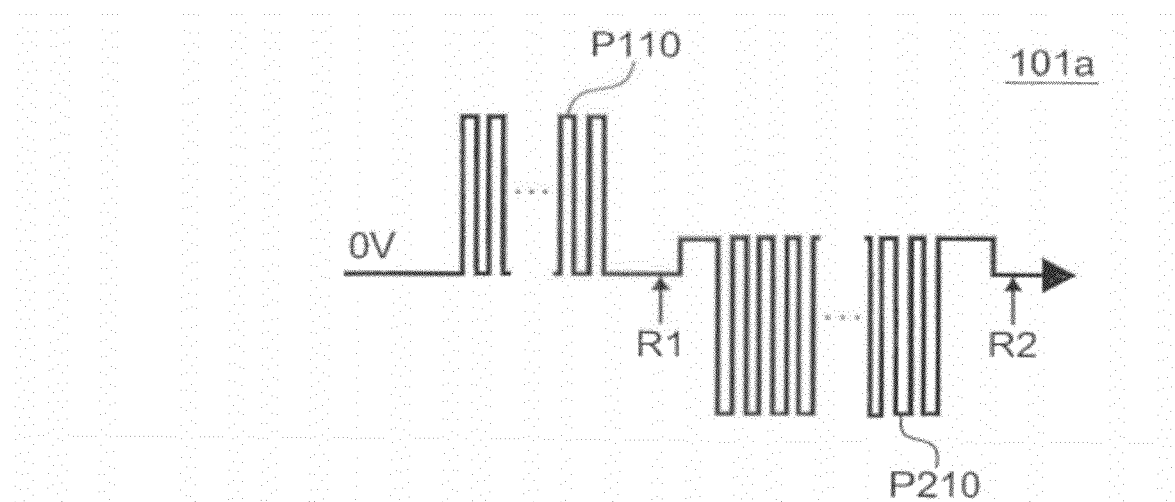
FIGS. 10A and 10B are schematic views illustrating characteristics of another nonvolatile semiconductor memory device according to the first embodiment of the invention.
Figure 10B:
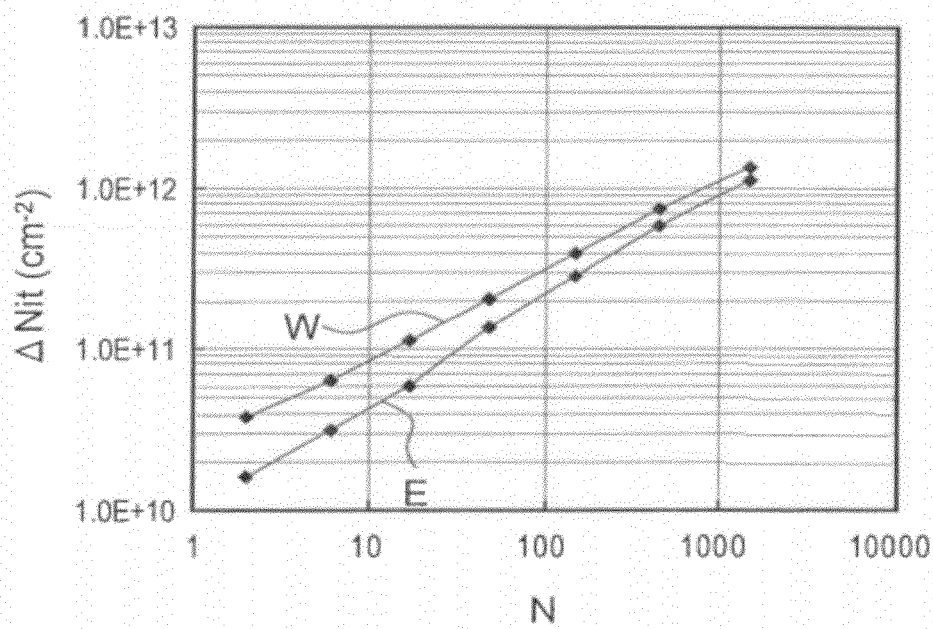

FIGS. 10A and 10B are schematic views illustrating characteristics of another nonvolatile semiconductor memory device according to the first embodiment of the invention.

That is, FIG. 10A illustrates waveforms of programming and erasing used in another nonvolatile semiconductor memory device 101a according to this embodiment. And, FIG. 10B shows a graph illustrating an evaluation result. The horizontal axis represents the number N of repeating of programming and erasing, and the vertical axis represents the increase amount ΔNit of the interface state.

The configuration of the memory cell of another nonvolatile semiconductor memory device 101a according to this embodiment is the same as the nonvolatile semiconductor memory device 101. However, as described below, with respect to the nonvolatile semiconductor memory device 101, the waveform used in erasing is different.

That is, as shown in FIG. 10A, in this evaluation experiment, the burst signal P110 for programming and the burst signal P210 for erasing are repeatedly applied, and the number N of repeating thereof is changed and the threshold reading R1 after programming and the threshold reading R2 after erasing are performed.

And, the pulse parameters used in the burst signal P110 for programming is the same as the nonvolatile semiconductor memory device 101.

On the other hand, the pulse parameters used in the burst signal P210 for erasing is as follows. That is, the high-level voltage (Vh2) is 2 V and the low-level voltage (Vl2) is −18 V. The period T21 of one pulse is 2 µs, and the application time T22 of one burst signal P210 for erasing is 2 ms, that is, the number of the pulses per burst signal P210 for erasing is 1000. The duty ratio in one period T21 is 50%, and the rise time and the fall time are 200 ns, respectively.

That is, in the nonvolatile semiconductor memory device 101a, the high-level voltage (Vh2) of the burst signal P210 for erasing is changed from 0 V of the nonvolatile semiconductor memory device 101 to 2 V. Other than this, the nonvolatile semiconductor memory device 101a is the same as the nonvolatile semiconductor memory device 101.

As shown in FIG. 10B, in another nonvolatile semiconductor memory device 101a of this embodiment, with respect to the number N of programming or erasing, the increase amount ΔNit of the interface state is further suppressed compared with the nonvolatile semiconductor memory device 101. For example, in the case of the nonvolatile semiconductor memory device 101, when the number N of repeating of programming or erasing is 1500, both of ΔNit of the programming side W and ΔNit of the erasing side E are about $1.1 \times 10^{12}$ cm$^{-2}$, and by contrast, in the case of the nonvolatile semiconductor memory device 101a, the ΔNit of the programming side W is $1.1 \times 10^{12}$ cm$^{-2}$ and the ΔNit of the erasing side E is $1.02 \times 10^{12}$ cm$^{-2}$, which is further decreased.

As described above, in the erasing operation, by enhancing the high-level voltage (Vh2), the interface state amount can be further lowered.

As described above, like another nonvolatile semiconductor memory device 101a according to this embodiment, in the burst signal P210 for erasing, the high-level voltage (Vh2) having no direct relation to the erasing operation is changed and thereby increase of the interface state amount can be suppressed, and the reliability can be further improved with holding stability of the erasing operation.

Similarly, in the programming operation using the burst signal, by lowering the low-level voltage (Vl1), the interface state amount can be further lowered.

As described above, in the burst signal P110 for programming, the low-level voltage (Vl1) having no direct relation to the programming operation is changed and thereby increase of the interface state amount can be suppressed, and the reliability can be further improved with holding stability of the programming operation.

As described previously, the low-level voltage (Vl1) of the burst signal P110 for programming and the high-level voltage (Vh2) of the burst signal P210 for erasing can be optionally set.

By the way, in performing programming or erasing on the memory cell, in the case where programming or erasing is insufficient or in the case of programming multilevel data, the pulse for programming or erasing is occasionally applied at a plurality of times. However, in this case, as shown in FIGS. 7A and 7B, there is no effect of suppression of the increase amount ΔNit of the interface state. That is, the invention is essentially different from the conventional case of applying the pulse for programming or erasing at a plurality of times. The inventors have newly found that as illustrated in FIGS. 7A, 7B, 9, 10A, and 10B, the amount of the interface state can be suppressed by applying the burst signal, and the invention has been achieved by applying the new finding.

That is, in the conventional nonvolatile semiconductor memory device, for example, the application times of the pulses of the signals for programming and erasing are generally equal to or longer than the time T13 of the verifying signal or the time of the pulse signal for reading. This is because the operation of programming or erasing is more certainly performed than the verifying or reading operation. Therefore, for example, when programming or erasing is insufficient, in the case of applying the pulse for programming or erasing at a plurality of times, the time of each of a plurality of signals for programming or erasing is about equal to or longer than the time of the verifying signal or the reading signal.

By contrast, in the case of the nonvolatile semiconductor memory device 101 according to this embodiment, the periods of pulse rows of the burst signal P110 for programming and the burst signal P210 for erasing are much shorter than the time of, for example, the verifying signal or the reading signal and are in a different class therefrom, for example, one-tenth or less than.

In the invention, the burst signal has a constant amplitude and a constant frequency. That is, in the burst signal P110 for programming, the value of the high-level voltage (Vh1) is constant and the value of the low-level voltage (Vl1) is constant. And, in the burst signal P110 for programming, the burst frequency Fb1 for programming is constant, that is, the period T11 is constant. In the burst signal P210 for erasing, the value of the high-level voltage (Vh2) is constant and the value of the low-level voltage (Vl2) is constant. And, in the burst signal P210 for erasing, the burst frequency Fb2 for erasing is constant, that is, the period T21 is constant.

Thereby, the programming operation and the erasing operation can be stabilized. That is, each of the high-level voltages (Vh1, Vh2) and the low-level voltages (Vl1, Vl2) is set to an appropriate voltage with respect to programming and erasing of charge on the memory cell. The most appropriate value enabling programming and erasing to be performed stably at high-speed is used for the voltage on the basis of specifications of dielectric constant or thickness or the like of the first insulating film 3A, specifications of dielectric constant or thickness or the like of the charge retention layer 3B, specifications of dielectric constant or thickness or the like of the second insulating film 3C, specifications of length or the like of the gate electrode 4, electric characteristics of the source drain regions 2 of the semiconductor layer 1 and the channel 1a, of the memory cell, and additionally, specifications of various wirings connecting the memory cell and the driving unit 20, areas of the memory cell and the driving unit 20, density of the memory cells per area when integrated, and allowable range of the manufacturing conditions of the memory cells and the driving unit 20.

In the nonvolatile semiconductor memory device according to this embodiment, the most appropriate amplitude (voltage value) allowable for design based on the stability of programming and erasing is used, and the burst waveform that is as high as possible is used. Thereby, the programming is stabilized and the increase amount ($\Delta Nit$) of the interface state can be reduced.

That is, from the characteristics illustrated in FIG. 9, it was found for the first time that as the burst frequency Fb increases, the increase amount $\Delta Nit$ of the interface state decreases. Therefore, as long as there is no adverse effect by distortion of the waveform, it is preferable with increasing burst frequency Fb. That is, it is preferable with decreasing period of the pulse.

In Patent document 2, a method for applying the pulse at a plurality of times in the nonvolatile semiconductor memory device having a split gate structure is disclosed, and in this case, the time of each of the pulses is changed. In this case, even when the above effect of reduction of the increase amount $\Delta Nit$ of the interface state is obtained by the pulse of the shortest time, because the pulse of a long time is also included, the effect of reduction of the increase amount $\Delta Nit$ of the interface state is small. That is, in patent document 2, because there is no findings about the phenomenon (relationship between the burst frequency Fb and $\Delta Nit$) illustrated in FIG. 9, the times of a plurality of the pulses are not considered at all.

By contrast, in this embodiment, the reduction of $\Delta Nit$ can be effectively expressed by setting the burst frequency to be constant at the highest value allowable for design.

On the other hand, in Patent document 3, a method for performing programming by step-up voltage is disclosed. However, in this case, programming or erasing of charge is performed not by the above most appropriate value of the voltage but by a waveform including voltage other than the above value. Therefore, the programming or erasing operation is performed not by the most appropriate condition but by a condition displaced from the most appropriate condition. Therefore, the programming or erasing operation cannot be stably performed, and programming becomes insufficient or erasing becomes insufficient.

And, also in this case, because there is no findings about the phenomenon (relationship between the burst frequency Fb and $\Delta Nit$) illustrated in FIG. 9, the times of a plurality of the pulses are not considered at all, and the effective reduction effect of the increase amount $\Delta Nit$ of the interface state which can obtained when the burst signal having a constant frequency is applied by a constant amplitude (voltage value) cannot be obtained.

In the nonvolatile semiconductor memory device 101 according to this embodiment, each of the burst signal P110 for programming and the burst signal P210 for erasing have a constant amplitude (voltage value) and a constant frequency. However, for example, in the case of programming multilevel information or the like, the voltage values or frequencies may be changed among different programming operations and among different erasing operations illustratively performed through verifying.

That is, in a first burst signal P110 (1) for programming in programming first information and a second burst signal P110 (2) for programming in programming second information, amplitudes (voltage values) or frequencies may be changed. Similarly, in a first burst signal P210 (1) for erasing in performing first erasing and a second burst signal P210 (2) for erasing in performing second erasing, amplitudes (voltage values) or frequencies may be changed. That is, in each of one burst signal P110 for programming and one burst signal P210 for erasing, it is sufficient that the amplitude (voltage value) is constant and that the frequency is constant.

Second Embodiment

The nonvolatile semiconductor memory device according to a second embodiment of the invention can be applied to a transistor-type memory cell having a charge storage layer or a floating dot layer as the charge retention layer.

The charge storage layer or the floating dot layer is not necessarily one layer, and may be illustratively two layers or three layers.

Hereinafter, the nonvolatile semiconductor memory device according to this embodiment will be described by using an example of an N-channel-type memory cell having the charge storage layer. The nonvolatile semiconductor memory device according to this embodiment is not limited to the N channel type, but can also be applied to a P channel type. In this case, impurities of the source drain regions and the semiconductor layer are set to be reverse in polarity, and voltages applied to the semiconductor layer and the gate electrode are exchanged, and thereby, the following descriptions can be analogized and applied.

Figure 11A:
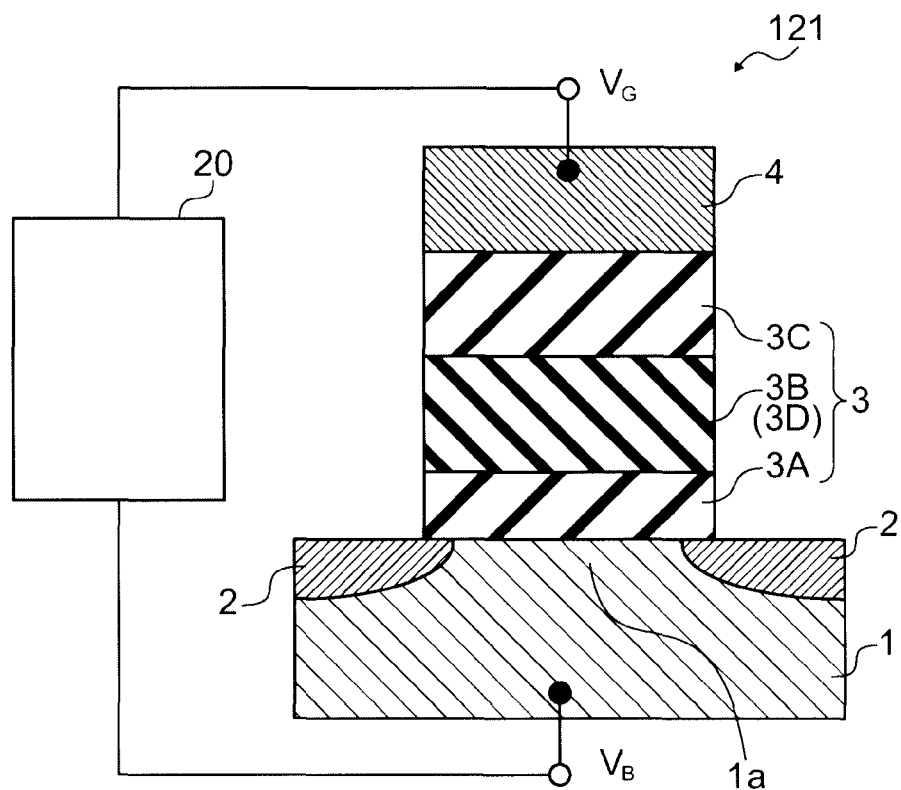
FIGS. 11A and 11B are schematic views illustrating configurations of the nonvolatile semiconductor memory device according to a second embodiment of the invention.
Figure 11B:
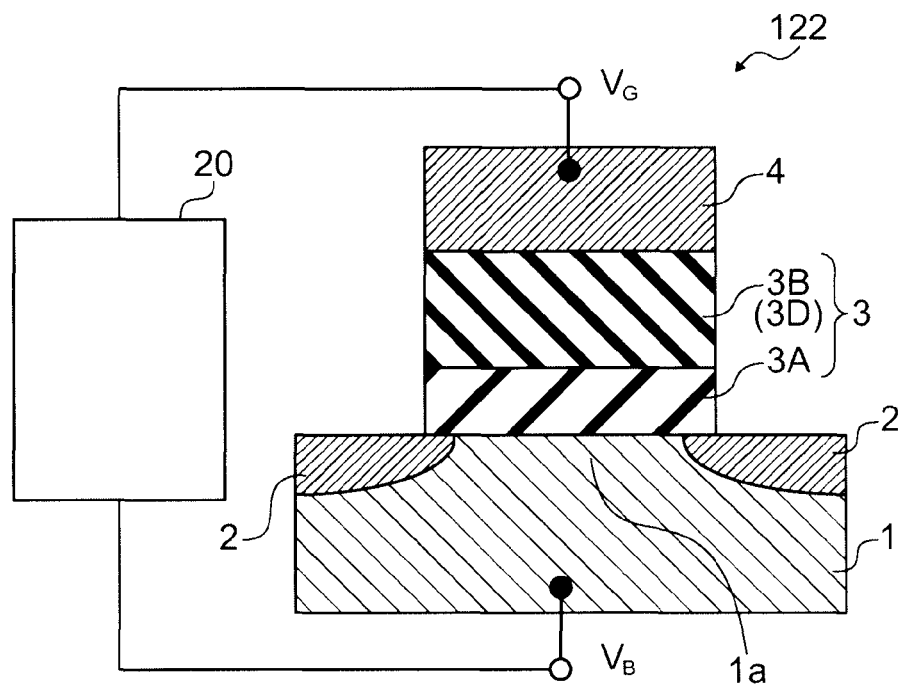

FIGS. 11A and 11B are schematic views illustrating the configuration of the nonvolatile semiconductor memory device according to a second embodiment of the invention.

That is, FIGS. 11A and 11B illustrate configurations of the nonvolatile semiconductor memory devices 121 and the nonvolatile semiconductor memory devices 122 according to the second embodiment of the invention respectively, and show one transistor-type memory cell. In FIGS. 11A and 11B, memory cells are formed on semiconductor layers 1 doped with a P-type impurity.

As shown in FIG. 11A, in the nonvolatile semiconductor memory device 121 according to this embodiment, on the semiconductor layer 1, the stacked structure 3 including the charge retention layer 3B is provided. And, on the stacked structure 3, the gate electrode 4 is provided. The stacked structure 3 has the charge retention layer 3B, the first insulating film 3A provided between the charge retention layer 3B and the semiconductor layer 1, and the second insulating film 3C provided between the charge retention layer 3B and the gate electrode 4.

The charge retention layer 3B of this case is the charge storage layer 3D. As described above, for the charge retention layer 3B, the floating dot layer may be used.

As described above, the nonvolatile semiconductor memory device 121 has a so-called NOMOS-type memory cell. The MONOS is an abbreviation of Metal-Oxide-Nitride-Oxide-Silicon. Additionally, a SONOS-type memory is one form of the MONOS-type memory cell. The SONOS is an abbreviation of Polysilicon-Oxide-Nitride-Oxide-Silicon. The Metal in the MONOS-type memory cell is a concept representing entirety of gate electrode and is a concept including a polysilicon electrode in the SONOS-type memory cell. The nonvolatile semiconductor memory device 121 according to this embodiment is suitably used for the MONOS-type memory cell including the SONOS-type memory cell.

As shown in FIG. 11B, in another nonvolatile semiconductor memory device 122 according to the second embodiment of the invention, the second insulating film 3C of the nonvolatile semiconductor memory device 121 is omitted. As described above, according to the configuration of the charge retention layer 3B, the second insulating 3C can be omitted.

As described above, the nonvolatile semiconductor memory device 122 has a so-called MNOS-type memory cell. The MNOS is an abbreviation of Metal-Nitride-Oxide-Silicon. The nonvolatile semiconductor memory device 122 according to this embodiment is suitably used for the MNOS-type memory cell.

Various materials described for the first embodiment can be used for the charge storage layer 3D, the first insulating film 3A, and the second insulating film 3C used for the nonvolatile semiconductor memory device 121 and the nonvolatile semiconductor memory device 122.

Hereinafter, the case of the nonvolatile semiconductor memory device 121 according to this embodiment will be described. However, the nonvolatile semiconductor memory device 122 is the same.

In the nonvolatile semiconductor memory device 121 according to this embodiment, charge distribution in parallel direction to the channel 1a inside the charge retention layer 3B (charge storage layer 3D) is controlled by applying the burst signal for at least any one of the programming operation and the erasing operation. Thereby, the charge distribution of parallel direction to the channel 1a is stored as the new information amount in the memory cell of the nonvolatile semiconductor memory device 121.

Also in the nonvolatile semiconductor memory device 121 according to this embodiment, the burst signal P110 for programming and the burst signal P210 for erasing described for FIGS. 4A to 6D can be used.

For example, as shown in FIGS. 5A to 5D, each of the pulses of the burst signal P110 for programming can have various shapes such as approximately square wave, trapezoidal shape, triangular shape, and distorted shape like a charging current.

In the burst signal P110 for programming, it is sufficient that the absolute value of the high-level voltage (Vh1) is larger than the absolute value of the low-level voltage (Vl1), and the low-level voltage (Vl1) is optional and the low-level voltage (Vl1) can be set to be various voltages.

On the other hand, as shown in FIGS. 6A to 6D, each of the pulses of the burst signal P210 for erasing can have various shapes such as approximately square wave, trapezoidal shape, triangular shape, and distorted shape like a charging current.

In the burst signal P210 for erasing, it is sufficient that the absolute value of the low-level voltage (Vl2) is larger than the absolute value of the high-level voltage (Vh2), and the high-level voltage (Vh2) is optional and the high-level voltage (Vh2) can be set to be various voltages.

Various parameters (periods T11, T12, application times T12, T22 of the burst signals, high-level voltage Vh1, Vh2, low-level voltage Vl1, Vl2, rise time and fall time, and so forth) described for the first embodiment can be applied to the write burst signal P110 and the erase burst signal P210.

By using the burst signal P110 for programming and the burst signal P210 for erasing described above for programming or erasing operations, respectively, the distribution in the parallel direction to the channel 1a of the charge captured by the charge storage layer 3D can be controlled.

In this case, a method for deriving a threshold distribution in the parallel direction to the channel 1a can be applied. This can illustratively be based on Charge Pumping method described in Masakatsu Tsuchiaki "A New Charge Pumping Method for Determining the Spatial Distribution of Hot-Carrier-Induced Fixed Charge in p-MOSFET's" IEEE TRANSACTION ON ELECTRON DEVICES, VOL. 40, NO. 10, OCTOBER 1993.

That is, the local threshold distribution in the parallel direction to the channel 1a corresponds to the local capturing amount of the charge in the parallel direction to the channel 1a inside the charge storage layer 3D, and the capturing state of the charge in the parallel direction to the channel 1a is controlled by utilizing this.

Hereinafter, in the nonvolatile semiconductor memory device 121 according to this embodiment, specific examples of the control of the distribution in the parallel direction to the channel 1a of the charge captured by the charge storage layer 3D will be described.

The memory cell of the nonvolatile semiconductor memory device 121 of the specific example to be described below has the same configuration as the nonvolatile semiconductor memory device 101 according to the first embodiment.

Figure 12:
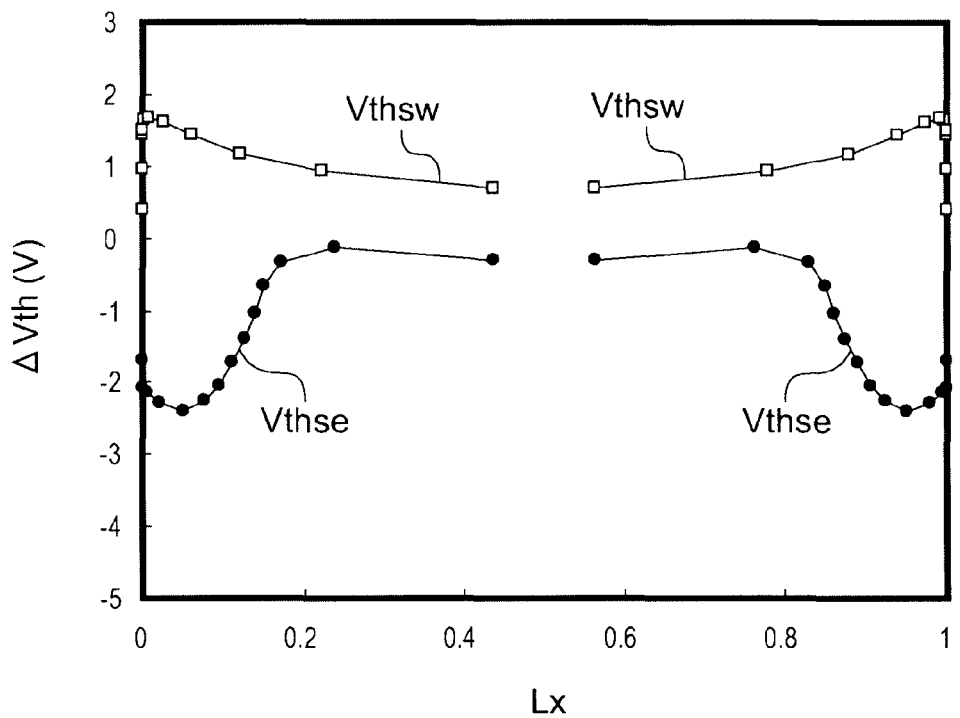
FIG. 12 shows a graph illustrating characteristics of the nonvolatile semiconductor memory device according to the second embodiment of the invention.

FIG. 12 shows a graph illustrating characteristics of the nonvolatile semiconductor memory device according to the second embodiment of the invention.

That is, FIG. 12 is a view showing aspect of increase of the amount of the interface state in repeating programming operation and erasing operation and is a view used suitably for comparing interface degradation in changing the pulse shape. The horizontal axis of FIG. 12 represents the relative distance Lx in the parallel direction to the channel 1a so that the gate length is 1, and the vertical axis of FIG. 12 represents a shift amount ΔVt of the local threshold voltage.

FIG. 12 illustrates changes of the threshold voltage in the parallel direction to the channel 1a of the nonvolatile semiconductor memory device 121 when the programming operation and the erasing operation are performed by using the same burst signal P110 for programming and the same burst signal P210 for erasing as described for the nonvolatile semiconductor memory device 101 according to the first embodiment.

In the nonvolatile semiconductor memory device 121, the potential of the source drain regions 2 is set to be the same as the potential of the semiconductor layer 1 in the programming operation and the erasing operation.

As shown in FIG. 12, in the nonvolatile semiconductor memory device 121 according to this embodiment, for the distribution of the threshold value in the parallel direction to the channel 1a, the threshold shift Vthsw of the programming side is almost uniform in the parallel direction to the channel 1a, and by contrast, the threshold shift Vthse of the erasing side is low in the vicinity of the source drain regions 2 and is high in the central part of the channel 1a. As described above, the distribution of the threshold value in the parallel direction to the channel 1a can be controlled.

Second Comparative Example

Figure 13:
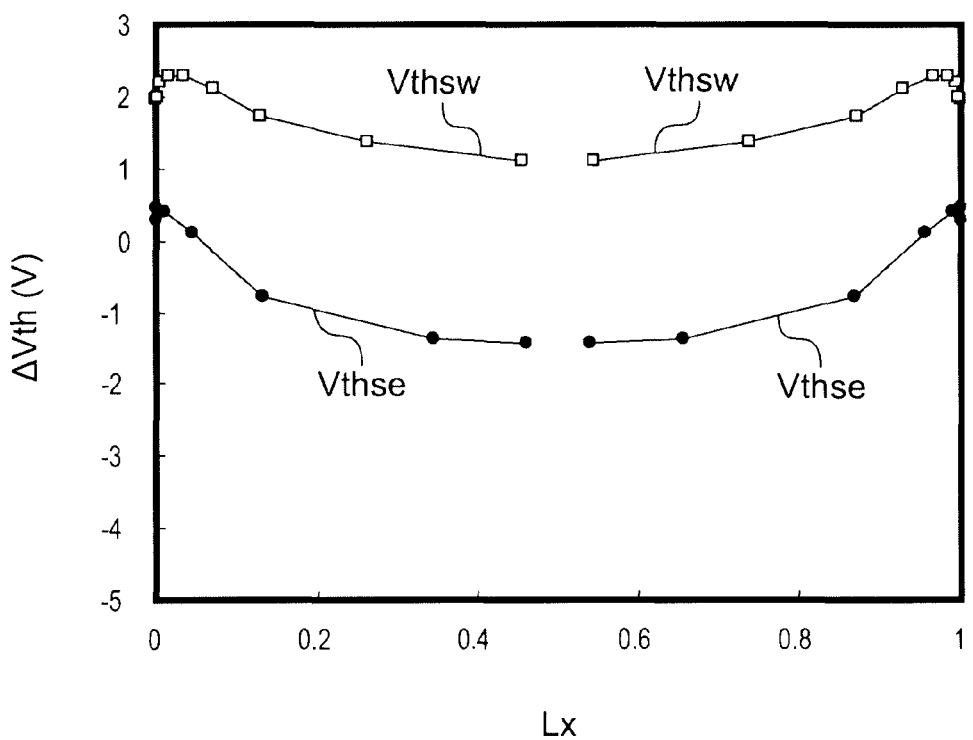
FIG. 13 shows a graph illustrating characteristics of the nonvolatile semiconductor memory device of a second comparative example.

FIG. 13 shows a graph illustrating characteristics of the nonvolatile semiconductor memory device of a second comparative example.

That is, FIG. 13 illustrates characteristics of the nonvolatile semiconductor memory device 109a of the second comparative example, and the horizontal axis of FIG. 13 represents the relative distance in the parallel direction to the channel 1a so that the gate length is 1, and the vertical axis of FIG. 13 represents a shift amount of the threshold voltage.

The configuration of the memory cell of the nonvolatile semiconductor memory device 109a of the second comparative example is the same as the nonvolatile semiconductor memory device 121. And, the pulse parameter of the pulse WP for programming used in the nonvolatile semiconductor memory device 109a of the second comparative example is the same as described for the nonvolatile semiconductor memory device 109 of the first comparative example.

Also in this case, in the programming operation and the erasing operation, the potential of the source drain regions 2 is set to be the same as the potential of the semiconductor layer 1.

As shown in FIG. 13, in the nonvolatile semiconductor memory device 109a of the second comparative example, for the distribution of the threshold value in the parallel direction to the channel 1a, both of the threshold shift Vthsw of the programming side and the threshold shift Vthse of the erasing side are almost uniform in the parallel direction to the channel 1a, and the distribution of the threshold value in the parallel direction to the channel 1a is not generated.

By contrast, as described previously for FIG. 12, in the nonvolatile semiconductor memory device 121 according to this embodiment, the threshold shift Vthse of the erasing side is low in the vicinity of the source drain regions 2 and is high in the central part of the channel 1a, and the distribution of the threshold value in the parallel direction to the channel 1a can be controlled.

And, the distribution in the parallel direction to the channel 1a is programmed as the new information amount, and read by the technique or the like to be described later, and thereby, high-density information can be recorded and reproduced.

As illustrated in FIG. 12, it is a phenomenon newly found at this time that the distribution of the threshold value in the parallel direction to the channel 1a can be controlled by using a burst signal, and the invention is achieved by applying the new finding.

With decreasing of the equivalent oxide film thickness in recent years, charge leakage from the charge retention layer 3B becomes significant, and decrease of the number of retainable charges has been seen as a problem, and introduction of the multilevel technique tends to become difficult, and on the other hand, with requirement of enlargement of the memory capacity, the introduction of the multilevel technique is essential. As described above, in Patent document 4, the multilevel technique in the NOR-type flash memory has been disclosed. However, according to the nonvolatile semiconductor memory device 121 according to this embodiment, the multilevel technique that is applicable to the NAND-type flash memory, which has the largest integration degree among the existing flash memories and has the largest capacity, can be provided.

Figure 14:
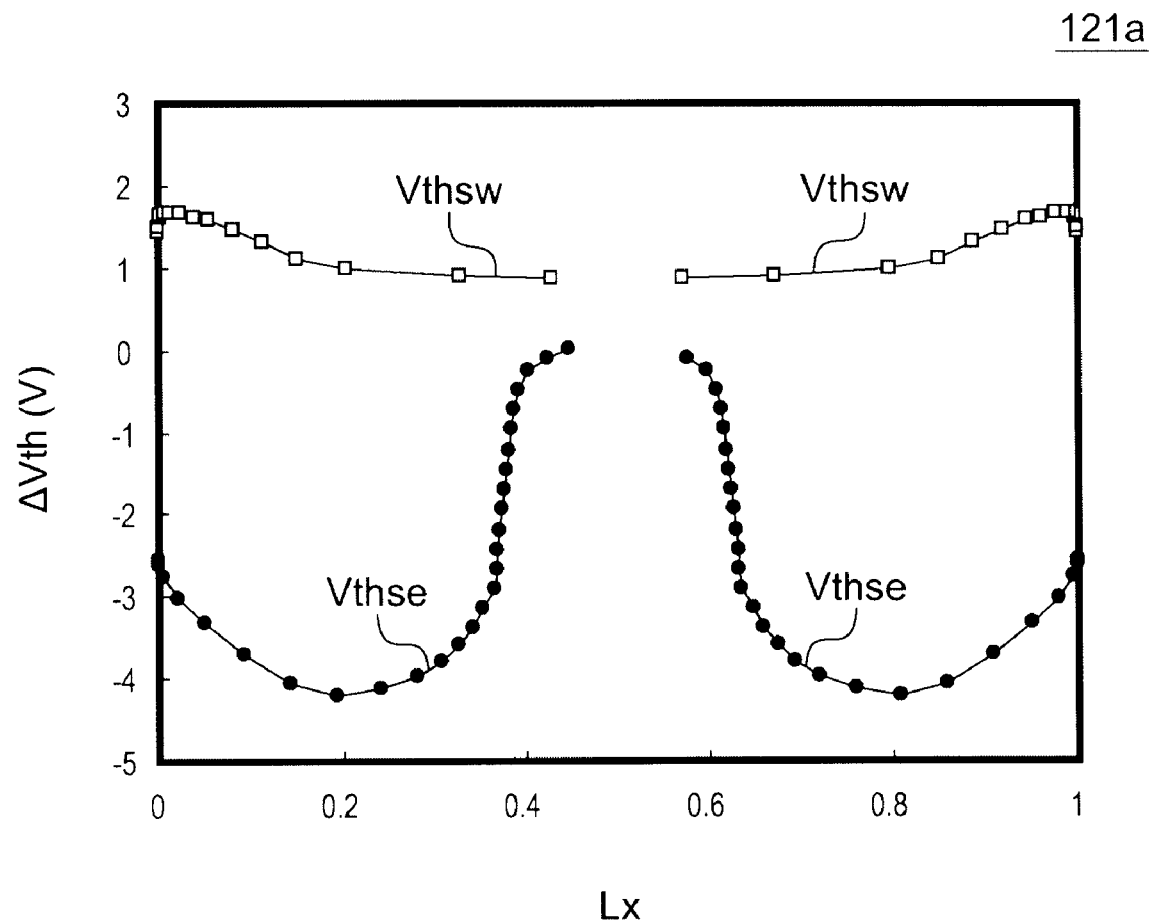
FIG. 14 shows a graph illustrating characteristics of another nonvolatile semiconductor memory device according to the second embodiment of the invention.

FIG. 14 shows a graph illustrating characteristics of another nonvolatile semiconductor memory device according to this embodiment.

The configuration of the memory cell of another nonvolatile semiconductor memory device 121a according to this embodiment is the same as the nonvolatile semiconductor memory device 121.

The nonvolatile semiconductor memory device 121a is based on the burst signal P110 for programming and the burst signal P210 for erasing that are the same as the nonvolatile semiconductor memory device 121. However, in this case, the potential of the source drain regions 2 is set to be electrically in a floating state. Other than this, the nonvolatile semiconductor memory device 121a is the same as the nonvolatile semiconductor memory device 121.

As shown in FIG. 14, in another nonvolatile semiconductor memory device 121a according to this embodiment, for the distribution of the threshold value in the parallel direction to the channel 1a, the threshold shift Vthsw of the programming side is almost uniform in the parallel direction to the channel 1a, and by contrast, the threshold shift Vthse of the erasing side is low in the vicinity of the source drain regions 2 and is high in the central part of the channel 1a. This phenomenon is more significant than in the nonvolatile semiconductor memory device 121 illustrated in FIG. 12. That is, the threshold shift Vthse of the erasing side in the nonvolatile semiconductor memory device 121a is lower in the vicinity of the source drain regions 2 than that of the nonvolatile semiconductor memory device 121.

As described above, in the nonvolatile semiconductor memory device 121a, the distribution of the threshold value in the parallel direction to the channel 1a can be controlled more efficiently.

As described above, like the nonvolatile semiconductor memory device 121 and the nonvolatile semiconductor memory device 121a, the programming operation and the erasing operation by using the burst signal P110 for programming and the burst signal P210 for erasing allow the distribution of the threshold value of the parallel direction to the channel 1a to be controlled.

In particular, when it comes to the distribution of the threshold value of the erasing side, the threshold value can be controlled locally in the vicinity of the source drain regions 2.

The local threshold distribution in the parallel direction to the channel 1a corresponds to the local charge distribution in the parallel direction to the channel 1a inside the charge storage layer 3D, and thus, this means that the programming operation and the erasing operation by using the burst signal P110 for programming and the burst signal P210 for erasing allow the charge distribution of the parallel direction to the channel 1a to be controlled.

In the case of using the burst signal P110 for programming and the burst signal P210 for erasing, setting the potential of the source drain regions 2 to be in a floating state enables the threshold distribution of erasing side to be changed. In particular, setting the potential of the source drain regions 2 to be in a floating state enables the local threshold value in the vicinity of the source drain regions 2 of the erasing side to be drastically lowered.

As described above, it is a phenomenon firstly found at this time that the retention state of charge in the parallel direction to the channel 1a can be changed by the potential of the source drain regions 2 being fixed potential or floating potential in applying the burst signal. By applying this phenomenon, the nonvolatile semiconductor memory device 121a according to this embodiment can more effectively control the retention state of charge in the parallel direction to the channel 1a.

As illustrated in FIGS. 12 and 14, the characteristics in the nonvolatile semiconductor memory devices 121 and 121a have the threshold distribution bilaterally-symmetric with respect to the parallel direction to the channel 1a. However, the invention is not limited thereto, and for example, by changing potential of any one of the source region and the drain region, asymmetric distribution of the threshold value can be formed.

That is, in the nonvolatile semiconductor memory devices 121, 121a, 122 according to this embodiment, by providing potential to any one of the source region and the drain region by using the burst signal P110 for programming and the burst signal P210 for erasing, the threshold distribution bilaterally-asymmetric with respect to the parallel direction to the channel 1a can also be formed.

Third Embodiment

Figure 15:
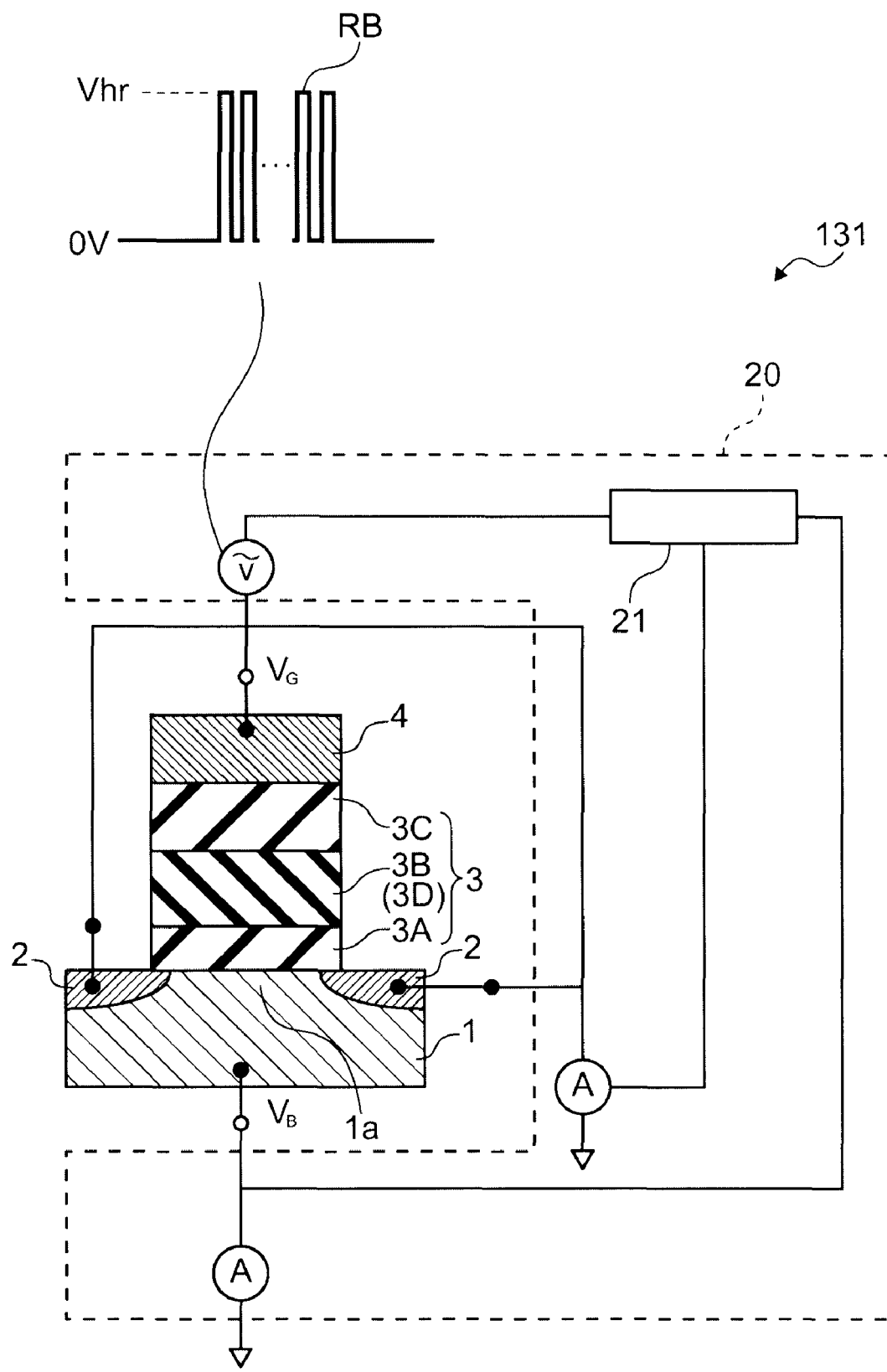
FIG. 15 is a schematic view illustrating the configuration of a nonvolatile semiconductor memory device according to a third embodiment of the invention.

FIG. 15 is a schematic view illustrating the configuration of the nonvolatile semiconductor memory device according to a third embodiment of the invention.

As shown in FIG. 15, the nonvolatile semiconductor memory device 131 of the invention is illustratively based on a transistor-type memory cell having the charge storage layer 3D like the nonvolatile semiconductor memory device 121 according to the second embodiment. That is, the nonvolatile semiconductor memory device 131 can be suitably applied to so-called MONOS-type memory cell or MNOS-type memory cell.

Hereinafter, the case where the memory cell that is the same as the memory cell of the nonvolatile semiconductor memory device 121 according to the second embodiment will be described.

In the nonvolatile semiconductor memory device 131 according to this embodiment, the driving unit 20 performs the programming operation and the erasing operation by at least any one of the burst signal P110 for programming and the burst signal P210 for erasing, and thereby the capturing position of charge in the parallel direction to the channel 1a is controlled.

The driving unit 20 detects the distribution (capturing position) of charge in the parallel direction to the channel 1a.

For the control of the capturing position of charge in the parallel direction to the channel 1a, the method described in the nonvolatile semiconductor memory devices 121 and 121a according to second embodiment can be used, and thus, the description thereof will be omitted. Hereinafter, the technique for detecting the capturing position of charge in the parallel direction to the channel 1a will be described.

The driving unit 20 reads information corresponding to the distribution of the threshold value in the parallel direction to the channel 1a, which corresponds to the capturing position of charge in the parallel direction to the channel 1a.

For example, in the nonvolatile semiconductor memory device 131, the driving unit 20 has a function of detecting any one of a current flowing between the source region and the substrate and a current flowing between the drain region and the substrate with applying the repeating pulse RB for reading to the gate electrode 4. That is, the semiconductor layer further includes a semiconductor region other than the source region and the drain region and the driving unit 20 has a function of detecting any one of a current flowing between the source region and the semiconductor region and a current flowing between the drain region and the semiconductor region with applying the repeating pulse RB for reading to the gate electrode 4.

Such measurement method of the current is called generally as "Charge Pumping", and the measurement value is called as "Charge Pumping current (Icp)". For the Charge Pumping current (Icp), for example, the previously cited document about the Charge Pumping method can be drawn upon.

As shown in FIG. 15, the repeating pulse RB for reading that is outputted from the control unit 21 of the driving unit 20 is applied to the gate electrode 4 of the memory cell. The repeating pulse RB for reading can be based on an analogous signal to the burst signal P110 for programming and the burst signal P210 for erasing that were previously described. The repeating pulse RB for reading may be based on a repeating pulse having a different voltage value or different frequency from that of the burst signal P110 for programming and the burst signal P210 for erasing. However, the high-level voltage (Vhr) in the repeating pulse RB for reading is set to be lower than, for example, the high-level voltage (Vh1) in the burst signal P110 for programming.

The driving unit 20 detects the amount of the current flowing through the semiconductor layer 1 (the semiconductor region or the source drain regions 2) while the repeating pulse RB for reading is applied.

In this case, the information corresponding to the distribution of the threshold value in the parallel direction to the channel 1a is illustratively read by sweeping the high-level voltage (Vhr) of the repeating pulse RB for reading.

Between reading of the programming side and reading of the erasing side, the high-level voltage (Vhr) of the repeating pulse RB for reading may be changed. However, hereinafter, the case where the high-level voltage (Vhr) is the same will be described.

Figure 16A:
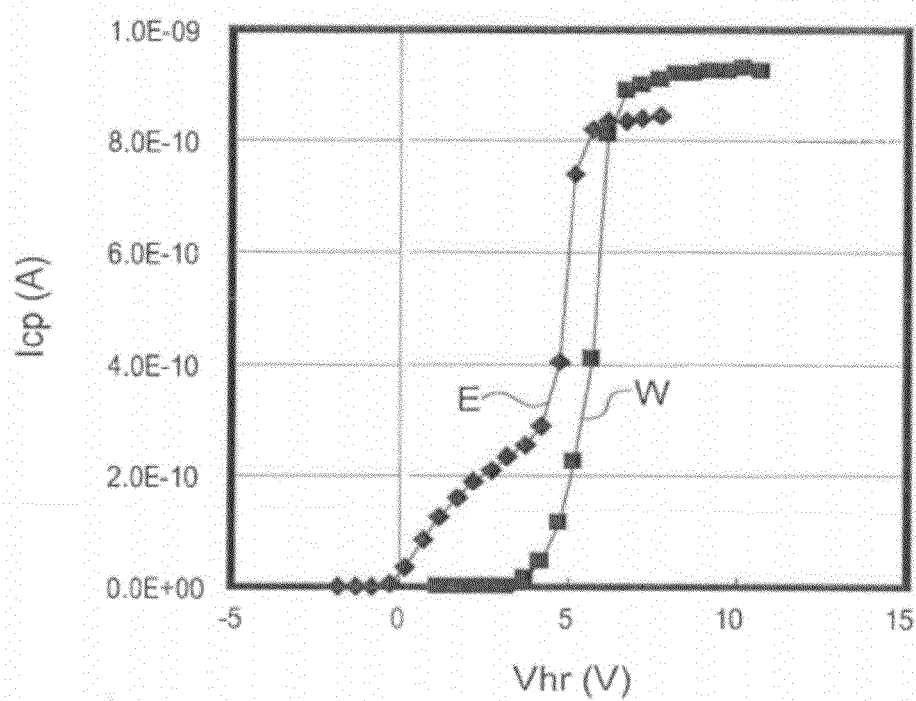
FIGS. 16A and 16B show graphs illustrating characteristics of the nonvolatile semiconductor memory device according to the third embodiment of the invention.
Figure 16B:
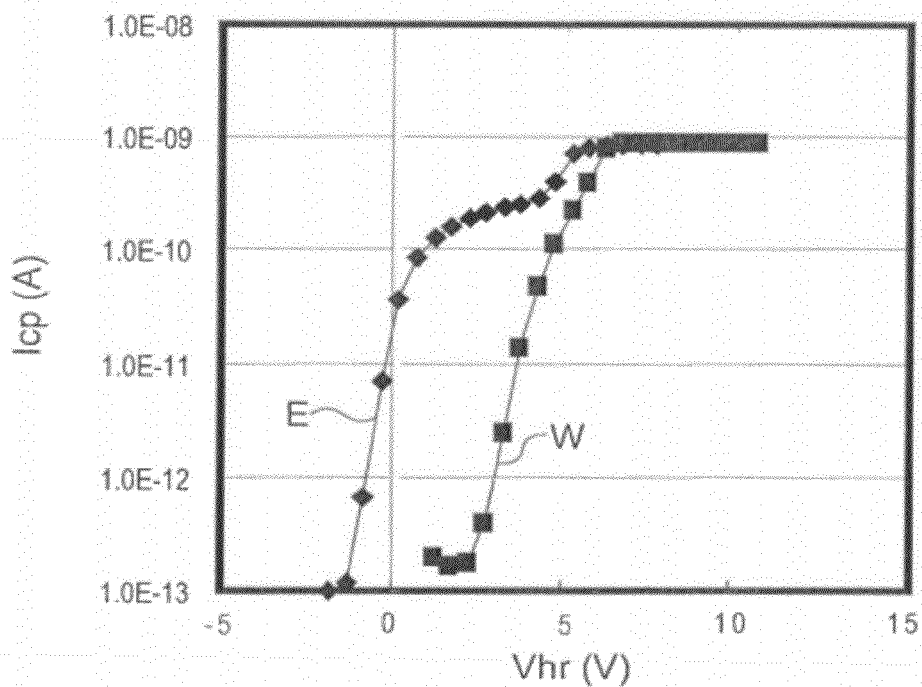

FIGS. 16A and 16B show graphs illustrating characteristics of the nonvolatile semiconductor memory device according to the third embodiment of the invention.

That is, FIGS. 16A and 16B illustrate detection results of Charge Pumping current (Icp) when the high-level voltage (Vhr) of the repeating pulse RB for reading is swept in the nonvolatile semiconductor memory device 131. The horizontal axis of the FIGS. 16A and 16B represents the high-level voltage (Vhr). The vertical axis of FIG. 16A represents Charge Pumping current (Icp) by an equally spaced scale, and the vertical axis of FIG. 16B represents Charge Pumping current (Icp) by a logarithmic scale. That is, FIGS. 16A and 16B expand Icp-Vhr characteristics of the programming side W and the erasing side E of the memory cell of the nonvolatile semiconductor memory device 131.

This measurement results relate to the memory cell having the same structure as the memory cell of the nonvolatile semiconductor memory device 121 according to the second embodiment. For the programming operation and the erasing operation on the memory cell, the driving condition described for FIG. 12 is used.

As shown in FIGS. 16A and 16B, in the programming side W and the erasing side E, shapes of plots of the Icp-Vhr characteristics are largely different. The difference of the shapes corresponds to the difference of the distribution of the threshold value in the parallel direction to the channel 1a illustrated in FIG. 12 between the programming side W (Vthsw) and the erasing side E (Vthse).

For example, the distribution corresponds to lowering of the local threshold value (Vthse) in the vicinity of the source drain regions 2, which can be seen in the erasing side in FIG. 12, and corresponds to the large value Icp in the low Vhr, which can be seen in the erasing side E in FIGS. 16A and 16B.

As described above, the driving unit 20 detects the current flowing through the semiconductor layer 1 (at least any one of the source drain regions 2 and the semiconductor region) with applying the repeating pulse RB for reading to the gate electrode 4 in reading the information according to the distribution of charge in the parallel direction to the channel 1a. In this case, the voltage value of the repeating pulse RB for reading is read by, for example, sweeping. Thereby, the information corresponding to the distribution of the threshold value in the parallel direction to the channel 1a of the memory cell can be obtained.

Thereby, the distribution of charge in the parallel direction to the channel 1a can be read, and by using the distribution as new information, high-density information can be stored and read.

Furthermore, in reading information according to the distribution of charge in the parallel direction to the channel 1a, the following method can be used.

That is, the threshold value of the memory cell is read, and the current flowing through the semiconductor layer1 (at least any one of the source drain regions 2 and the semiconductor region) is detected with applying the repeating pulse RB for reading to the gate electrode 4. That is, on the basis of the read threshold value, the current is detected with applying the repeating pulse RB for reading having the high-level voltage (Vhr) having predetermined voltage difference from the threshold value.

For example, in the case of characteristics illustrated in FIGS. 16A and 16B, the threshold value in erasing side E is illustratively read as about 5 V, and Icp is read with applying the repeating pulse RB for reading of 2.4 V that is lower than the read threshold value by 2.6 V serving as the predetermined voltage value. The magnitude of Icp can give the information corresponding to the distribution of the threshold value in the parallel direction to the channel 1a of the memory cell.

Figure 17:
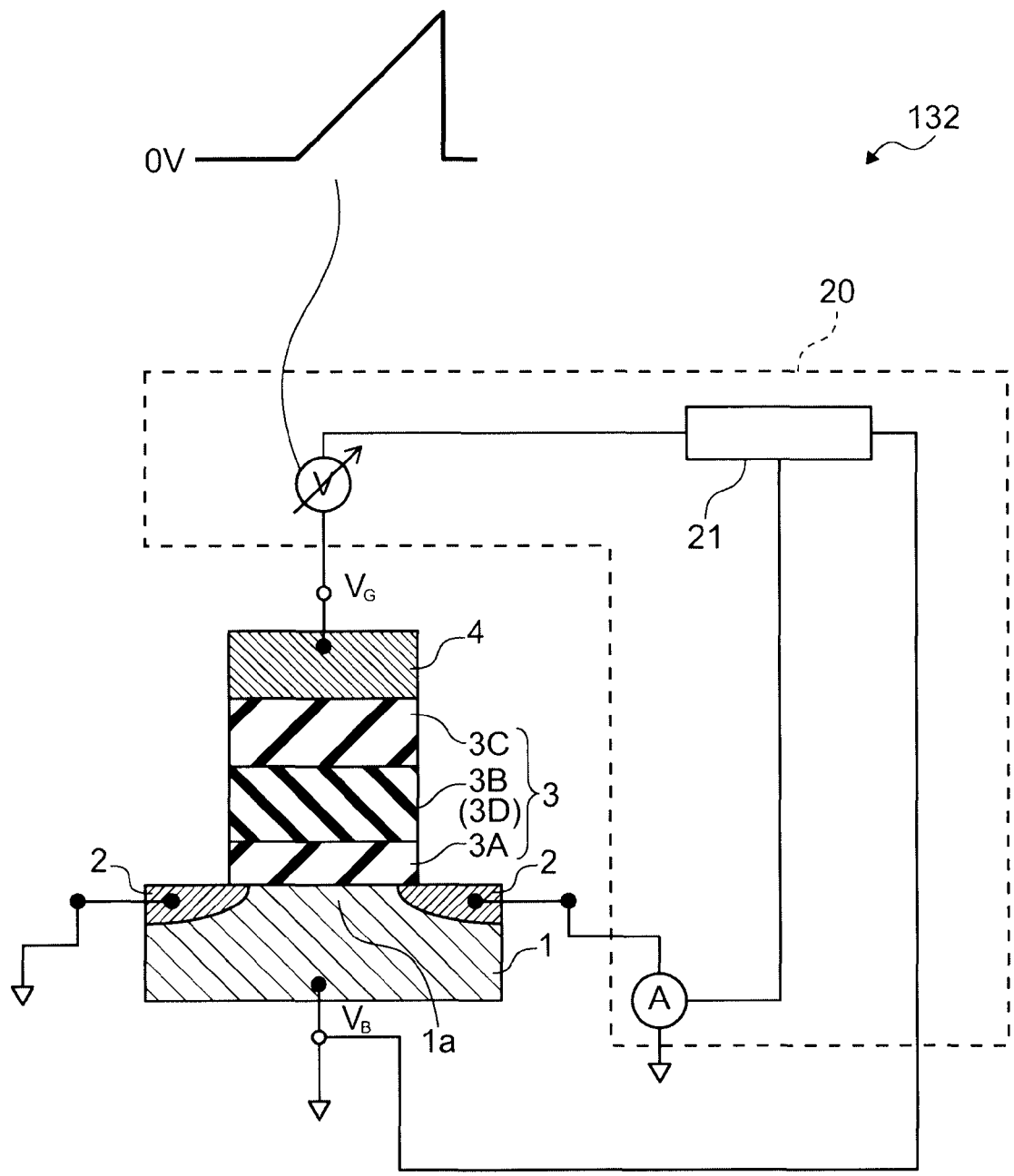
FIG. 17 is a schematic view illustrating the configuration of another nonvolatile semiconductor memory device of the third embodiment of the invention.

FIG. 17 is a schematic view illustrating another configuration of another nonvolatile semiconductor memory device of the third embodiment of the invention.

As shown in FIG. 17, in another nonvolatile semiconductor memory device 132 according to the third embodiment of the invention, the driving unit 20 is disposed and connected to the memory cell so as to read trans-conductance of the memory cell. The trans-conductance is defined as inclination in the drain current (Id)-gate voltage (Vg) characteristic of the memory cell.

The driving unit 20 applies the gate voltage (Vg) that is the output of the control unit 21 to the gate electrode 4 of the memory cell. The driving unit 20 detects the current amount flowing through the source drain regions 2 while the gate voltage (Vg) is applied. That is, with sweeping the gate voltage (Vg), the drain current (Id) is detected.

Hereinafter, the measurement results will be described on the characteristics of the memory cell having the same structure as the memory cell of the nonvolatile semiconductor memory device 121 according to the second embodiment. For the programming operation and the erasing operation on the memory cell, the driving condition described for FIG. 12 is used.

Figure 18:
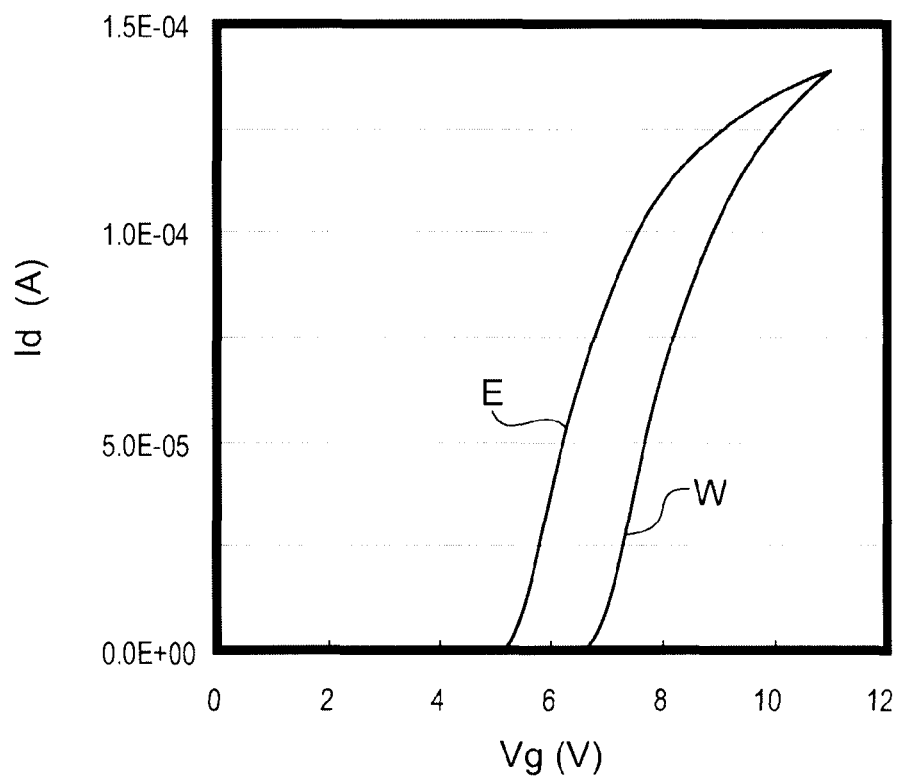
FIG. 18 shows a graph illustrating characteristics of the another nonvolatile semiconductor memory device according to the third embodiment of the invention.

FIG. 18 shows a graph illustrating characteristics of another nonvolatile semiconductor memory device according to third embodiment of the invention.

That is, FIG. 18 illustrates the measurement result of the drain current (Id)—gate voltage (Vg) of the memory cell, and the horizontal axis represents gate voltage (Vg) and the vertical axis represents drain current (Id). FIG. 18 illustrates the Id-Vg characteristics of the programming side W and the erasing side E of the memory cell.

As shown in FIG. 18, between the programming side W and the erasing side E, the shapes of the plots of the Id-Vg characteristics are largely different. The difference of the shapes corresponds to the difference of the distribution of the threshold value in the parallel direction to the channel 1a illustrated in FIG. 12 between the programming side W (Vthsw) and the erasing side E (Vthse).

Specifically, the inclination (trans-conductance) of the plots of the Id-Vg characteristic of FIG. 18 corresponds to the shape of the distribution of the threshold value in the parallel direction to the channel 1a in FIG. 12.

That is, change of the distribution of charge in the parallel direction to the channel 1a provides the same behavior as change of the effective length of the channel 1a, and thereby, the inclination of the Id-Vg characteristic is changed.

In deriving the trans-conductance, first the threshold value characteristics of the memory cell are read. The threshold value characteristics are characteristics for the threshold value in the Id-Vg characteristic and include, for example, shapes of curves of rising and saturation characteristic and so forth of the Id-Vg characteristics. And, the voltage based on the read threshold value characteristics is applied to the gate electrode 4 of the memory cell to read the trans-conductance of the memory cell. In this case, for example, the voltage shifted by the predetermined voltage from the read threshold value so as to correspond to change of the inclination of the Id-Vg characteristic is applied to the gate electrode 4, and thereby, the trans-conductance of the memory cell in the voltage can be read.

For example, in the case of the characteristic of erasing E illustrated in FIG. 18, 5.5 V that is the voltage of rising of the Id-Vg characteristic is set to be the threshold value, and the voltage of 7.0 V that is the predetermined voltage of 1.5 V added to the 5.5 V is applied to the gate electrode 4, and the inclination (trans-conductance) of the Id-Vg characteristic of this case can be detected. For example, in the case of adopting 10.5 V serving as the voltage of saturation of the Id-Vg characteristic as the threshold value, the voltage of 7.0 V that is lower than the 10.5 V by 3.5 V serving as the predetermined voltage is applied to the gate electrode 4, and thereby, the inclination (trans-conductance) of the Id-Vg characteristic of this case can be detected.

When the threshold value characteristics of the memory cell are preliminarily known, reading of the threshold value characteristics of the memory cell can be omitted.

As described above, according to another nonvolatile semiconductor memory device 132 according to this embodiment, detecting the trans-conductance allows the information corresponding to the distribution of the threshold value (and the charge inside the charge retention layer 3B) in the parallel direction to the channel 1a of the memory cell to be obtained.

Figure 19:
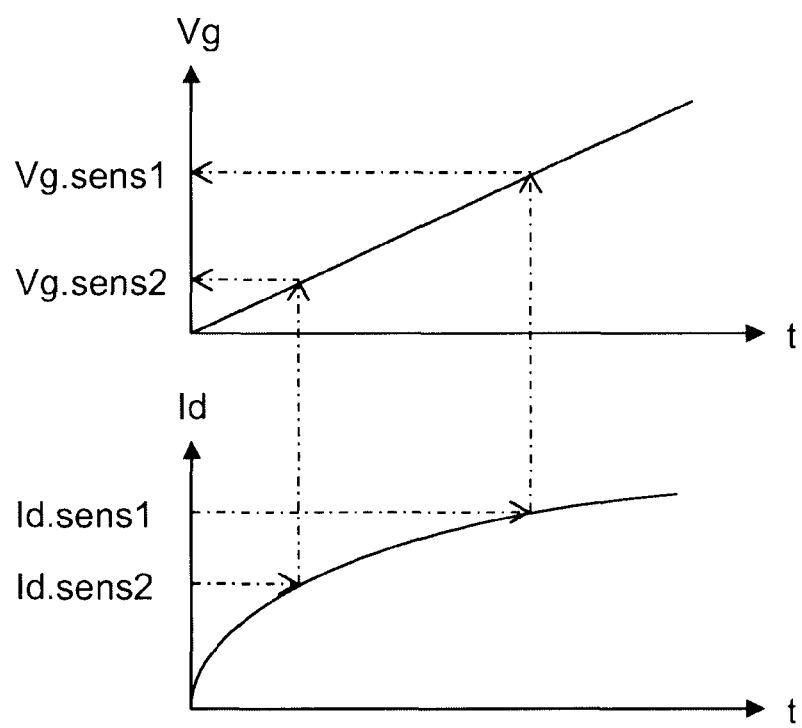
FIG. 19 shows a graph illustrating the operation of the another nonvolatile semiconductor memory device according to the third embodiment of the invention.

FIG. 19 shows graphs illustrating operation of another nonvolatile semiconductor memory device according to the third embodiment of the invention.

That is, FIG. 19 illustrates the operation of the derivation of trans-conductance. The horizontal axis represents time t, and the vertical axis of the upper view of FIG. 19 represents gate voltage Vg, and the vertical axis of the lower view represents drain current Id.

In this specific example, for example, two or more reference values of the drain current Id are set, and the gate voltages Vg when the drain currents Id of the reference values flow are detected, and thereby, the trans-conductance is obtained.

As shown in FIG. 19, two or more particular reference values of the drain current Id are set. In this specific example, as the reference values, Id.sens1 and Id.sens2 are set. The gate voltages Vg when the drain currents Id of the reference values flow, namely, Vg.sens1 and Vg.sens2 are obtained. And, the inclination (trans-conductance) between the two points in the Id-Vg characteristic can be obtained by the four values.

As described above, in reading the information according to the distribution of charge in the parallel direction to the channel 1a, the driving unit 20 applies the signal for reading the threshold value of the memory cell to the memory cell, and applies the signal for reading the trans-conductance of the memory cell to the memory cell.

Thereby, the information corresponding to the distribution of the threshold value (and the charge inside the charge retention layer) in the parallel direction to the channel 1a of the memory cell is obtained.

As described above, also in this case, the threshold value characteristics of the memory cell is read, and on the basis of the read threshold value characteristics, the reference values of the above drain current Id can be determined. The transconductance of the memory cell is read by applying the voltages corresponding to the reference values of the drain current Id to the gate electrode 4. When the threshold value characteristics of the memory cell are preliminarily known, reading of the threshold value characteristics of the memory cell can be omitted.

Fourth Embodiment

The nonvolatile semiconductor memory device according to a fourth embodiment of the invention has a memory cell array in which a plurality of memory cells of at least any one of the first to third embodiments.

The memory cell array can be memory cell arrays having various forms. For example, various structures of the memory cell array such as not only NAND-type or NOR-type but also AND-type, DINOR-type, stack-type, three-layer-polysilicon-type, 3Tr-NAND-type, and so forth are applicable.

As one example thereof, the NAND-type memory cell array based on the nonvolatile semiconductor memory device 101 according to the first embodiment will be described. However, the invention is not limited thereto, but can be applied to the memory cell arrays having all of the structures based on at least any one of the above first to third nonvolatile semiconductor memory devices.

Figure 20:
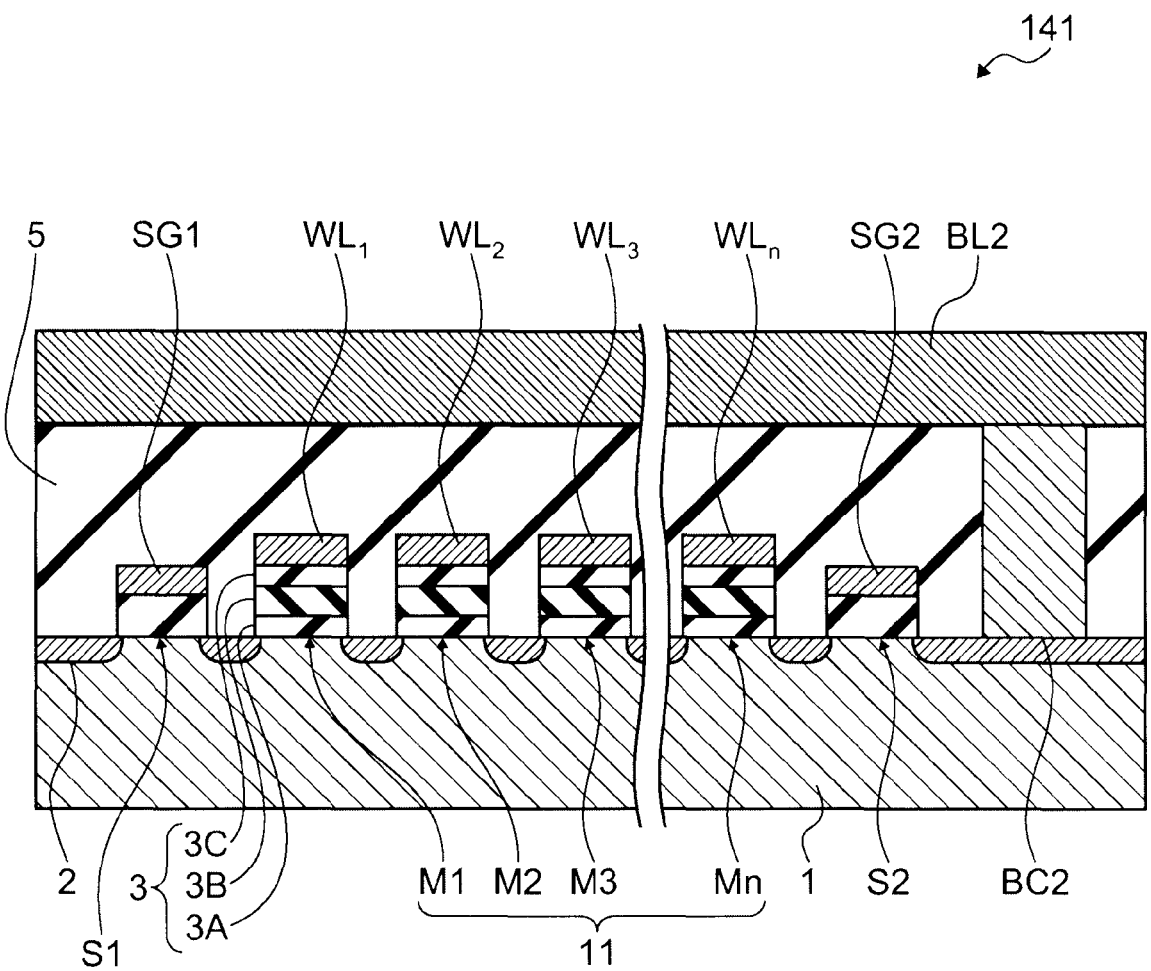
FIG. 20 is a schematic cross-sectional view illustrating the configuration of a nonvolatile semiconductor memory device according to a fourth embodiment of the invention.

FIG. 20 is a schematic cross-sectional view illustrating the configuration of the nonvolatile semiconductor memory device according to the fourth embodiment of the invention.

That is, FIG. 20 is a cross-sectional view in the row direction of the NAND string. The NAND string represents the minimum structure of the NAND-type memory cell array, and in the NAND-type memory cell array, a plurality of NAND strings are disposed in parallel.

As shown in FIG. 20, in the nonvolatile semiconductor memory device 141 of this embodiment, a plurality of transistor-type memory cells ($M_1$ to $M_n$) are arranged on the semiconductor layer 1. The gate electrode of each of the memory cells is electrically in contact with the adjacent NAND string row and is called as word line ($WL_1$ to $WL_n$). In the surface portions of the semiconductor layer 1 below the intervals of the word lines, source drain regions 2 are formed. The memory cells ($M_1$ to $M_n$) are arranged in the row direction and in the line direction intersecting with the row direction, and thereby, a memory cell array 11 (not shown) is constituted.

A first select transistor S1 and a second select transistor S2 are formed from general MOSFET. The gate electrodes of the first and second select transistors S1 and S2 are a first select gate SG1 and a second select gate SG2, respectively.

On the MONOS-type memory cells and the select transistors, an interlayer insulating film 5 (for example, silicon dioxide) is thickly deposited.

A bit line BL2 is connected to the source drain regions 2 adjacent to the second select transistor S2 through a bit contact BC2. Similarly, a bit line BL1 is connected to the source drain regions 2 adjacent to the second select transistor S1 through a bit contact BC1. The bit lines BL1, BL2 are wires for the source drain regions 2. The bit contacts BC1, BC2 are electrical contact terminals to the source drain regions 2. The bit contact BC1 and the bit line BL1 are not shown.

In the nonvolatile semiconductor memory device 141 having such a configuration, the burst signal described in the first to third embodiments is applied to the NAND string between the semiconductor layer 1 and the word lines $WL_1$ to $WL_n$.

For example, when the potential of the source drain regions 2 is set to be the same as the potential of the semiconductor layer 1, the following operation is performed. That is, the burst signal P110 for programming is applied to the ith (i=1 to n) memory cell $M_i$. That is, for example, in the programming operation, for the potential of the source drain regions 2 in the programming operation, the potential of the bit line BL2 is set to be 0V and the potential of the bit line BL1 is set to be the power voltage, and the potential of the threshold value or more of the second select transistor S2 is provided to the second select gate SG2, and the potential of less than the threshold value of the first select transistor S1 is provided to the first select gate SG1, and the potentials of threshold values or more of the memory cells $M_1$ to $M_{i-1}$ and $M_{i+1}$ to $M_n$ are provided to the word lines $WL_1$ to $WL_{i-1}$ and $WL_{i+1}$ to $WL_n$ respectively, and thereby, the potential of the source drain regions 2 becomes the same as the potential of the semiconductor layer 1.

For example, the burst signal P210 for erasing is applied to the ith (i=1 to n) memory cell $M_i$. That is, for example, in the erasing operation, for the potential of the source drain regions 2 in the erasing operation, the potential of the bit line BL2 is set to be in a floating state and the potential of the bit line BL1 is set to be in a floating state, and the potentials of the first and second select gates SG1, SG3 are set to be in a floating state, and the potentials of the word lines $WL_1$ to $WL_n$ are set to be 0 V, and thereby, the potential of the source drain regions 2 becomes the same as the potential of the semiconductor layer 1.

Any one of the memory cells $M_1$ to $M_n$ in the FIG. 20 may be adopted as the memory cell, and the voltage having either positive polarity or negative polarity may be applied to the gate electrode of the memory cell as long as any one of the burst signals described in the first to third embodiments is applied between the semiconductor layer 1 and the gate electrode of the memory cell.

In the nonvolatile semiconductor memory device 141 having such a configuration, the configuration of the case of reading the distribution of the charge in the parallel direction to the channel 1a will be described by the configuration of the nonvolatile semiconductor memory device 131 according to the third embodiment.

In reading the distribution of charge in the parallel direction to the channel 1a in the ith (i=1 to n) memory cell $M_i$, for example, the semiconductor layer 1 or the bit line BL1, BL2 is connected to the current detection unit of the driving unit 20. The potentials of the threshold values or more of the first and second select transistors S1, S2 are provided to the first and second select gates SG1, SG2, respectively, and the potentials of threshold values or more of the memory cells $M_1$ to $M_{i-1}$ and $M_{i+1}$ to $M_n$ are provided to the word lines $WL_1$ to $WL_{i-1}$ and $WL_{i+1}$ to $WL_n$, respectively, and furthermore, a burst signal is provided to the word line $WL_i$. Thereby, the configuration illustrated in FIG. 15 can be realized, and the distribution of charge in the parallel direction to the channel in the memory cell can be read.

In the nonvolatile semiconductor memory device 141, reading the distribution of the charge in the parallel direction to the channel 1a by the configuration of the nonvolatile semiconductor memory device 132 according to the third embodiment can be performed as follows.

In reading the distribution of charge in the parallel direction to the channel 1a in the ith (i=1 to n) memory cell $M_i$, for example, the semiconductor layer 1 and the bit line BL1 are earthed, and the bit line BL2 is connected to the current detection unit of the driving unit 20. The potentials of the threshold values or more of the first and second select transistors S1, S2 are provided to the first and second select gates SG1, SG2, respectively, and the potentials of threshold values or more of the memory cells $M_1$ to $M_{i-1}$ and $M_{i+1}$ to $M_n$ are provided to the word lines $WL_1$ to $WL_{i-1}$ and $WL_{i+1}$ to $WL_n$, respectively, and furthermore, the word line $WL_i$ is connected to the voltage generation circuit of the driving unit 20. Thereby, the configuration illustrated in FIG. 17 can be realized, and the distribution of charge in the parallel direction to the channel 1*a* in the memory cell can be read.

Figure 21:
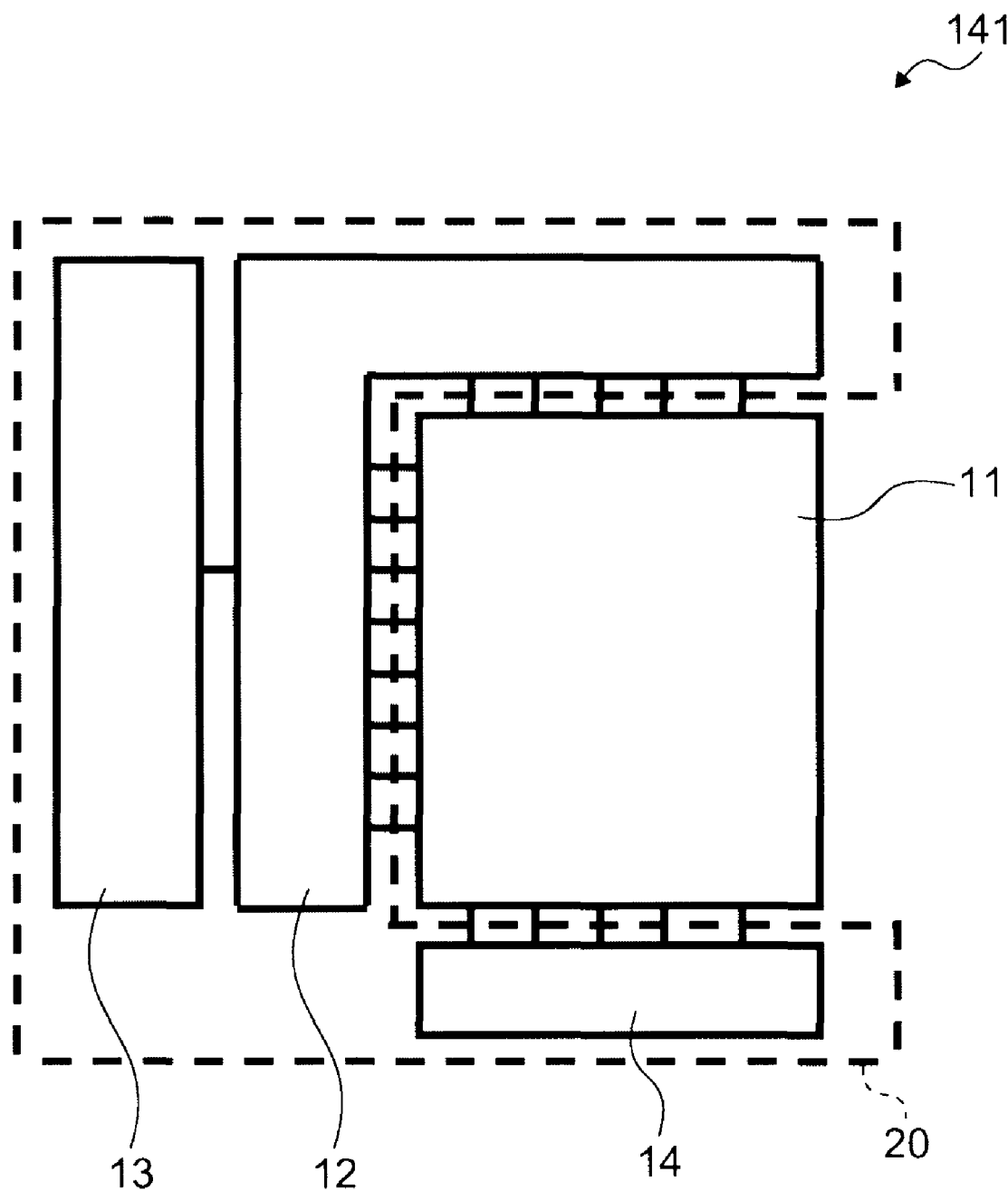
FIG. 21 is a schematic view illustrating the configuration of the nonvolatile semiconductor memory device according to the fourth embodiment of the invention.

FIG. 21 is a schematic view illustrating the configuration of the nonvolatile semiconductor memory device according to the fourth embodiment of the invention.

As shown in FIG. 21, the nonvolatile semiconductor memory device 141 according to this embodiment has the memory cell array 11 in which a plurality of memory cells described for the first to third embodiments are arranged and the driving unit 20 for driving the memory cell array. The driving unit has a power generation circuit 13, a voltage control circuit 12, and a reading circuit 14. By the configuration, the burst signal P110 for programming and the burst signal P210 for erasing, which are described for the first and second embodiments, are applied to the memory cells of the memory cell array 11. The distribution of the charge in the parallel direction to the channel 1*a* can be read by the operation described for the third embodiment.

The nonvolatile semiconductor memory device 141 according to this embodiment enables interface degradation caused by the programming erasing operations at the interface between the semiconductor layer 1 and the first insulating film 3A contacting the semiconductor layer 1 in the memory cells having the charge retention layers 3B to be reduced.

In the memory cell having the charge storage layer 3D or the floating dot layer, the position of the captured charge in the parallel direction to the channel 1*a* inside the charge storage layer can be controlled, and also, the information corresponding to the position of the captured charge in the parallel direction to the channel 1*a* inside the charge storage layer can be read.

Fifth Embodiment

The fifth embodiment of the invention is a method for driving a nonvolatile semiconductor memory device. The method for driving the nonvolatile semiconductor memory device according to this embodiment is the method for driving the nonvolatile semiconductor memory device having the memory cell including, the semiconductor layer 1 having the channel 1*a* and the source drain regions 2 (source region and drain region) provided at the both sides of the channel 1*a*, the first insulating film 3A provided on the channel 1*a*, the charge retention layer 3B provided on the first insulating film 3A, and the gate electrode 4 provided on the charge retention layer 3B. The burst signal having a constant voltage value and a constant frequency is applied between the gate electrode 4 and the semiconductor layer 1, and at least any one of programming and erasing of charge is performed on the charge retention layer 3.

Thereby, the method for driving the nonvolatile semiconductor memory device in which the capturing position of the charge in the parallel direction to the channel inside the charge retention layer is controlled and in which the stress applied to insulating films is reduced can be provided.

Specifically, as described for FIGS. 3A and 3B, in the programming operation and the erasing operation, verifying can be performed.

That is, after at least any one of the programming and the erasing, inspection reading signal is applied between the gate electrode 4 and the semiconductor layer 1 to read the threshold value of the memory cell.

In the method for driving a nonvolatile semiconductor memory device according to this embodiment, the period of a plurality of pulse rows included in the burst signal is shorter than the application time of the inspection reading signal.

As described for the first embodiment, it is desirable that the frequency of the burst signal is 10 kHz to 10 MHz. It is further desirable that the frequency of the burst signal is 100 kHz to 1 MHz.

Figure 22A:
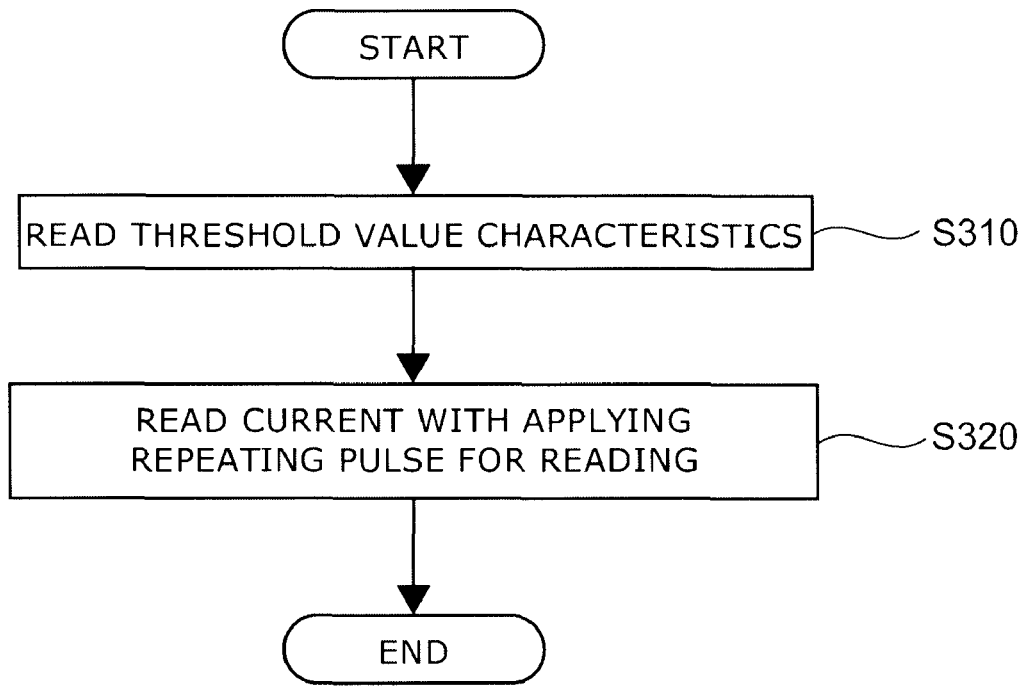
FIGS. 22A and 22B show flow charts illustrating a method for driving a nonvolatile semiconductor memory device according to a fifth embodiment of the invention.
Figure 22B:
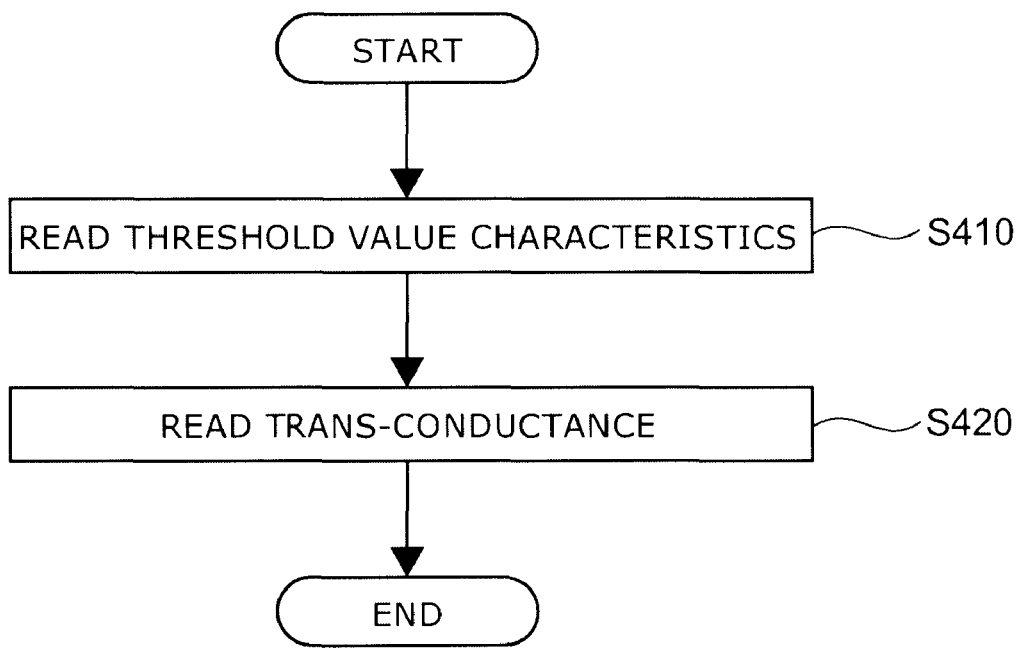

FIGS. 22A and 22B are flow charts illustrating the method for driving the nonvolatile semiconductor memory device according to the fifth embodiment of the invention.

That is, FIG. 22A illustrates the method for carrying out the driving method described for the nonvolatile semiconductor memory device 131, and FIG. 22B illustrates the driving method described for the nonvolatile semiconductor memory device 132.

That is, as shown in FIG. 22A, in reading information according to the distribution of the charge in the parallel direction to the channel 1*a*, for example, the threshold value of the memory cell is read (Step S310). On the basis of the read threshold value, for example, the repeating pulse RB for reading having the high-level voltage (Vhr) with the predetermined voltage difference from the threshold value is applied to the gate electrode 4, and therewith, the current flowing through the semiconductor layer (at least any one of the source drain regions 2 and the semiconductor region) (Step S320) is detected.

Alternatively, with applying the repeating pulse RB for reading to the gate electrode 4 while sweeping the high-level voltage (Vhr), the current flowing through the semiconductor layer 1 (at least any one of the source drain regions 2 and the semiconductor region) is detected (Step S320). When the high-level voltage (Vhr) is changed and applied as described above, Step S310 in which the threshold value of the memory cell is preliminarily read is not required.

As shown in FIG. 22B, in reading the information according to the distribution of the charge in the parallel direction to the channel 1*a*, first, the threshold value characteristics of the memory cell are read (Step S410). On the basis of the read threshold value characteristics, the voltage having the predetermined voltage difference from the threshold value is applied to the gate electrode 4 to read the trans-conductance of the memory cell (Step S420). In the above description, when the threshold value characteristics of the memory cell are preliminarily known, the Step S420 for reading the threshold value characteristics of the memory cell can be omitted.

By such a method, the capturing position of the charge in the parallel direction to the channel 1*a* inside the charge retention layer can be read, and by using the capturing position as the new information, high-density information can be stored.

As described above, the embodiments of the invention have been described with reference to specific examples. However, the invention is not limited to the specific examples. For example, the specific configuration of each of the components constituting the nonvolatile semiconductor memory device and the method for driving the same is included in the scope of the invention, as long as the invention can be carried out by appropriate selection from the known range by those skilled in the art and the same effect can be obtained.

Moreover, combination of two or more components of the respective specific examples in the technically possible range is included in the scope of the invention as long as including the spirit of the invention.

In addition, all of the nonvolatile semiconductor memory devices and the methods for driving the same that can be carried out with appropriately design-modified by those skilled in the art on the basis of the nonvolatile semiconductor memory devices and the methods for driving the same described above as the embodiments of the invention belong to the scope of the invention as long as including the spirit of the invention.

In addition, it is understood that those skilled in the art can achieve various variations and modifications and that the variations and the modifications belong to the scope of the invention.

The invention claimed is:

1. A nonvolatile semiconductor memory device comprising:
a memory cell including: a semiconductor layer including, a channel, and a source region and a drain region provided on both sides of the channel; a first insulating film provided on the channel; a charge retention layer provided on the first insulating film; and a gate electrode provided on the charge retention layer; and
a driving unit configured to perform a programming operation,
in the programming operation, the driving unit is:
configured to apply a first burst signal between the gate electrode and the semiconductor layer for programming charge on the charge retention layer, the first burst signal having a first constant amplitude and a first constant frequency, the first constant amplitude having a first low-level voltage and a first high-level voltage being higher than the first low-level voltage;
configured to apply a first verifying signal between the gate electrode and the semiconductor layer for reading a threshold value of the memory cell after the applying the first burst signal, an absolute value of the first verifying signal being smaller than an absolute value of the first high-level voltage; and
configured to apply the first low-level voltage between the gate electrode and the semiconductor layer after the applying the first burst signal and before the applying the first verifying signal.

2. The memory device according to claim 1, wherein the memory cell includes a second insulating film provided between the charge retention layer and the gate electrode.

3. The memory device according to claim 1, wherein the charge retention layer includes a floating electrode.

4. The memory device according to claim 1, wherein the charge retention layer includes a charge storage layer having one or a plurality of insulating layers.

5. The memory device according to claim 1, wherein the charge retention layer includes a floating dot layer having a structure in which grains made of conductive material are dispersed in an insulator.

6. The memory device according to claim 1, wherein the first constant frequency is 10 kHz or more and 10 MHz or less.

7. The memory device according to claim 1, wherein the first burst signal includes a plurality of pulses each of which has a period of Ta of 100 nanoseconds to 0.1 milliseconds, the first burst signal has a rise time of the pulse to change from the first low-level voltage to the first high-level voltage and a fall time of the pulse to change from the first high-level voltage to the first low-level voltage that are from Ta/20 seconds to Ta/2 seconds.

8. The memory device according to claim 1, wherein polarity of the first high-level voltage is different from polarity of the first low-level voltage.

9. The memory device according to claim 1, wherein potential of at least one of the source region and the drain region during the applying of the first burst signal is a fixed potential or a floating potential.

10. The memory device according to claim 4, wherein the driving unit performs the programming operation so that the charge has a distribution in a parallel direction to the channel.

11. The memory device according to claim 10, wherein the driving unit reads information according to the distribution.

12. The memory device according to claim 11, wherein in reading the information according to the distribution, the driving unit detects a current flowing through the semiconductor layer with applying a repeating pulse for reading to the gate electrode.

13. The memory device according to claim 11, wherein in reading the information according to the distribution, the driving unit reads a trans-conductance of the memory cell by applying voltage based on a threshold value characteristic of the memory cell to the gate electrode of the memory cell.

14. A method for driving a nonvolatile semiconductor memory device including a memory cell including: a semiconductor layer including, a channel, and a source region and a drain region provided on both sides of the channel; a first insulating film provided on the channel; a charge retention layer provided on the first insulating film; and a gate electrode provided on the charge retention layer, the method comprising:
performing a programming operation, the performing the programming operation including:
applying a first burst signal between the gate electrode and the semiconductor layer for programming charge on the charge retention layer, the first burst signal having a first constant amplitude and a first constant frequency, the first constant amplitude having a first low-level voltage and a first high-level voltage being higher than the first low-level voltage;
applying a first verifying signal between the gate electrode and the semiconductor layer for reading a threshold value of the memory cell after the applying the first burst signal, an absolute value of the first verifying signal being smaller than an absolute value of the first high-level voltage; and
applying the first low-level voltage between the gate electrode and the semiconductor layer after the applying the first burst signal and before the applying the first verifying signal.

15. The method according to claim 14, wherein the first constant frequency is 10 kHz or more and 10 MHz or less.

16. The method according to claim 14, wherein the first burst signal includes a plurality of pulses each of which has a period of Ta of 100 nanoseconds to 0.1 milliseconds, the first burst signal has a rise time of the pulse to change from the first low-level voltage to the first high-level voltage and a fall time of the pulse to change from the first high-level voltage to the first low-level voltage that are from Ta/20 seconds to Ta/2 seconds.

17. The method according to claim 14, wherein polarity of the first high-level voltage is different from polarity of the first low-level voltage.

18. The method according to claim 14, wherein potential of at least one of the source region and the drain region during the applying of the first burst signal is a fixed potential or a floating potential.

19. The method according to claim 14, wherein the charge retention layer is one of a charge storage layer and a floating dot layer, and the charge has a distribution in a parallel direction to the channel.

20. The method according to claim 19, wherein the driving unit reads information according to the distribution.

21. The device according to claim 1, wherein the driving unit further performs an erasing operation, in the erasing operation, the driving unit is further:
- configured to apply a second burst signal between the gate electrode and the semiconductor layer for erasing charge on the charge retention layer, the second burst signal having a second constant amplitude and a second constant frequency, the second constant amplitude having a second high-level voltage and a second low-level voltage being lower than the second high-level voltage;
- configured to apply a second verifying signal between the gate electrode and the semiconductor layer for reading the threshold value of the memory cell after the applying the second burst signal, an absolute value of the second verifying signal being smaller than an absolute value of the second low-level voltage; and
- configured to apply the second high-level voltage between the gate electrode and the semiconductor layer after the applying the second burst signal and before the applying the second verifying signal.

22. The method according to claim 14, further comprising performing an erasing operation, the erasing operation including:
- applying a second burst signal between the gate electrode and the semiconductor layer for erasing charge on the charge retention layer, the second burst signal having a second constant amplitude and a second constant frequency, the second constant amplitude having a second high-level voltage and a second low-level voltage being lower than the second high-level voltage;
- applying a second verifying signal between the gate electrode and the semiconductor layer for reading the threshold value of the memory cell after the applying the second burst signal, an absolute value of the second verifying signal being smaller than an absolute value of the second low-level voltage; and
- applying the second high-level voltage between the gate electrode and the semiconductor layer after the applying the second burst signal and before the applying the second verifying signal.

23. A nonvolatile semiconductor memory device comprising:
- a memory cell including: a semiconductor layer including, a channel, and a source region and a drain region provided on both sides of the channel; a first insulating film provided on the channel; a charge retention layer provided on the first insulating film; and a gate electrode provided on the charge retention layer; and
- a driving unit configured to perform an erasing operation, in the erasing operation, the driving unit is:
  - configured to apply a burst signal between the gate electrode and the semiconductor layer for erasing charge on the charge retention layer, the burst signal having a constant amplitude and a constant frequency, the constant amplitude having a high-level voltage and a low-level voltage being lower than the high-level voltage;
  - configured to apply a verifying signal between the gate electrode and the semiconductor layer for reading a threshold value of the memory cell after the applying the burst signal, an absolute value of the verifying signal being smaller than an absolute value of the low-level voltage; and
  - configured to apply the high-level voltage between the gate electrode and the semiconductor layer after the applying the burst signal and before the applying the verifying signal.

24. A method for driving a nonvolatile semiconductor memory device including a memory cell including: a semiconductor layer including, a channel, and a source region and a drain region provided on both sides of the channel; a first insulating film provided on the channel; a charge retention layer provided on the first insulating film; and a gate electrode provided on the charge retention layer, the method comprising:
- performing an erasing operation, the performing erasing operation including:
  - applying a burst signal between the gate electrode and the semiconductor layer for erasing charge on the charge retention layer, the burst signal having a constant amplitude and a constant frequency, the constant amplitude having a high-level voltage and a low-level voltage being lower than the high-level voltage;
  - applying a verifying signal between the gate electrode and the semiconductor layer for reading a threshold value of the memory cell after the applying the burst signal, an absolute value of the verifying signal being smaller than an absolute value of the low-level voltage; and
  - applying the high-level voltage between the gate electrode and the semiconductor layer after the applying the burst signal and before the applying the verifying signal.

* * * * *